United States Patent
Aono et al.

(10) Patent No.: US 7,067,888 B2
(45) Date of Patent: Jun. 27, 2006

(54) SEMICONDUCTOR DEVICE AND A METHOD OF MANUFACTURING THE SAME

(75) Inventors: Hideki Aono, Tachikawa (JP); Kousuke Okuyama, Kawagoe (JP); Kozo Watanabe, Kokubunji (JP); Kenichi Kuroda, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 349 days.

(21) Appl. No.: 09/985,303

(22) Filed: Nov. 2, 2001

(65) Prior Publication Data

US 2002/0063284 A1 May 30, 2002

(30) Foreign Application Priority Data

Nov. 28, 2000 (JP) ............... 2000-361548

(51) Int. Cl.
*H01L 29/772* (2006.01)
(52) U.S. Cl. ............... 257/391; 257/203; 257/235; 257/327; 257/392
(58) Field of Classification Search ........... 257/203, 257/218, 235, 327, 335, 336, 344, 408, 391, 257/392; 438/286, 305, 306, 163, FOR. 175, 438/FOR. 188
See application file for complete search history.

(56) References Cited

U.S. PATENT DOCUMENTS

| | | | |
|---|---|---|---|
| 5,239,196 A * | 8/1993 | Ikeda et al. | 257/385 |
| 5,334,870 A * | 8/1994 | Katada et al. | 257/371 |
| 5,572,480 A * | 11/1996 | Ikeda et al. | 365/230.06 |
| 5,734,185 A * | 3/1998 | Iguchi et al. | 257/336 |
| 5,780,912 A * | 7/1998 | Burr et al. | 257/408 |
| 5,830,788 A * | 11/1998 | Hiroki et al. | 438/199 |
| 5,834,347 A * | 11/1998 | Fukatsu et al. | 438/232 |
| 5,898,203 A * | 4/1999 | Yoshitomi et al. | 257/344 |
| 6,297,105 B1 * | 10/2001 | Guo | 438/286 |
| 6,323,525 B1 * | 11/2001 | Noguchi et al. | 257/385 |
| 2001/0053099 A1 * | 12/2001 | Hidaka et al. | 365/189.11 |
| 2002/0017669 A1 * | 2/2002 | Sugiura et al. | 257/296 |
| 2002/0019104 A1 * | 2/2002 | Miyagi | 438/307 |

* cited by examiner

*Primary Examiner*—George Fourson
*Assistant Examiner*—Joannie Adelle Garcia
(74) *Attorney, Agent, or Firm*—Antonelli, Terry, Stout and Kraus, LLP.

(57) ABSTRACT

Semiconductor regions for the suppression of short channel effects are not provided for a pMIS and an nMIS that constitute an inverter circuit of an input first stage of an I/O buffer circuit, whereas semiconductor regions for the suppression of short channel effects are provided for pMIS and nMIS of inverter circuits of the next stage of an I/O buffer circuit.

14 Claims, 21 Drawing Sheets

FIG. 26(a)
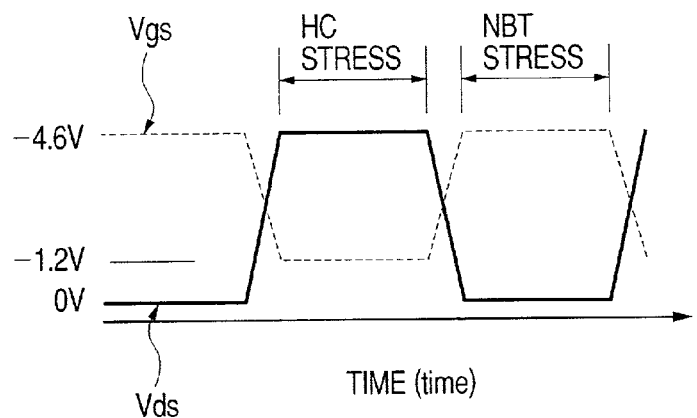
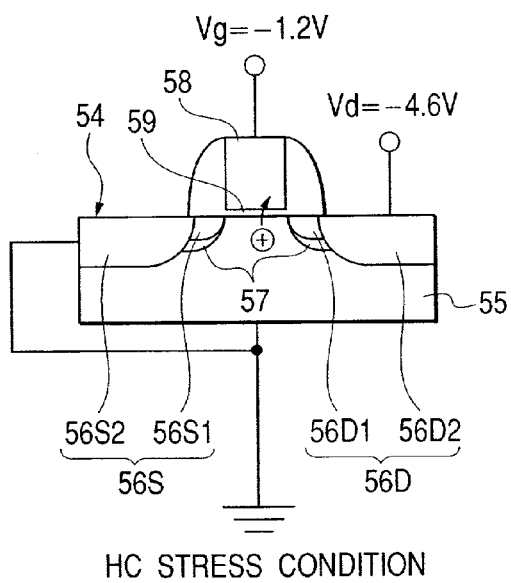
HC STRESS CONDITION
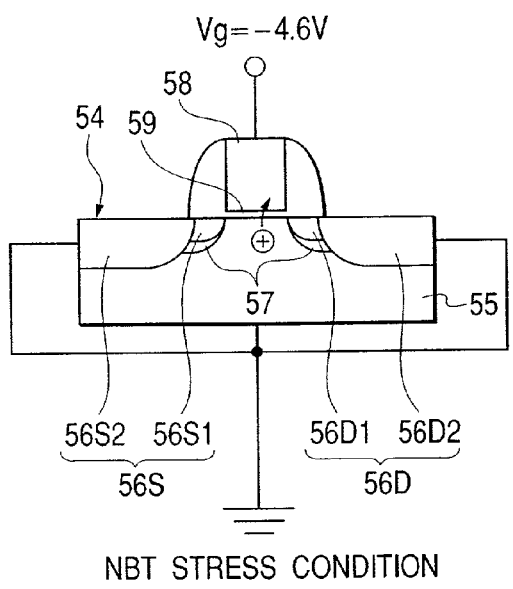
NBT STRESS CONDITION

SEMICONDUCTOR DEVICE AND A METHOD OF MANUFACTURING THE SAME

TECHNICAL FIELD

The present invention relates to a semiconductor device and a method of manufacture thereof; and, more particularly, the invention relates to a technique that is effective for application to a semiconductor device provided with a plurality of field effect transistors on the same semiconductor substrate, and its method of manufacture.

BACKGROUND OF THE INVENTION

According to a technique studied by the present inventors, drain structures used for both a field effect transistor of an input initial or first stage, which directly receives an input signal, and each of plural field effect transistors in a subsequent stage are identical to one another. Namely, semiconductor regions of conduction types opposite to conduction types of semiconductor regions for drains of both the field effect transistor of the input first stage and each of the field effect transistors in a subsequent stage are respectively provided in the neighborhood of the semiconductor regions for the drains of the field effect transistor of the input first stage and each of the field effect transistors of the subsequent stage to thereby suppress or prevent short channel effects. The gate length of the field effect transistor of the input first stage is made greater than the gate lengths of the field effect transistors of the subsequent stage to thereby ensure resistance to hot carriers and improve the life of the device with respect to its characteristic degeneration.

SUMMARY OF THE INVENTION

However, the present inventors have newly discovered that the technique of increasing the gate length of the field effect transistor of the input first stage involves the following problems which were not recognized in the prior art.

Namely, a problem arises in that, with the scaling of each field effect transistor, the field effect transistor of the input first stage is also in the process of falling into difficulties in ensuring a large gate length and the resistance to hot carriers is degenerated. According to discussions based on the result of experiments by the present inventors in particular, the present inventors have for the first time discovered the problem that NBT (Negative Bias Temperature) degeneration of a p channel type field effect transistor of an input first stage is serious, and the resistance to hot carriers is significantly degenerated. This is believed to occur because the hot-carrier degeneration of the p channel type field effect transistor is further accelerated, with the result that, when an input signal, such as a TTL (Transistor—Transistor Logic) signal or the like, is directly applied to the input of the p channel type field effect transistor of the input first stage, an NBT stress and a hot-carrier stress are alternately applied with alternating current (hereinafter called "AC") operation. Such hot-carrier degeneration is low in gate-length dependence in a manner similar to the NBT degeneration, and a mere increase in gate length encounters difficulties in ensuring the desired resistance to the hot carriers.

An object of the present invention is to provide a technique that is capable of enhancing hot-carrier resistance of a semiconductor device provided with a plurality of field effect transistors.

The above, other objects, and novel features of the present invention will become more apparent from the following description and the accompanying drawings.

Summaries of typical aspects of the invention disclosed in the present application will be described in brief as follows:

The present invention is characterized in that a drain structure of a first field effect transistor, which directly receives a signal inputted from the outside, is configured as a structure having a satisfactory hot-carrier resistance and is made different from drain structures of field effect transistors other than it.

Further, the present invention is characterized in that a drain structure of a first field effect transistor, which directly receives a signal inputted from the outside, is not provided with semiconductor regions for the suppression of a short channel effect, whereas drain structures of field effect transistors other than it are provided with semiconductor regions for the suppression of short channel effects.

BRIEF DESCRIPTION OF THE DRAWINGS

FIGS. 26(a) through 26(c) are diagrams showing one example of stresses effectively applied to a p channel type MIS (FET at a burn-in test;

DETAILED DESCRIPTION OF THE PREFERRED EMBODIMENTS

Figure 1:
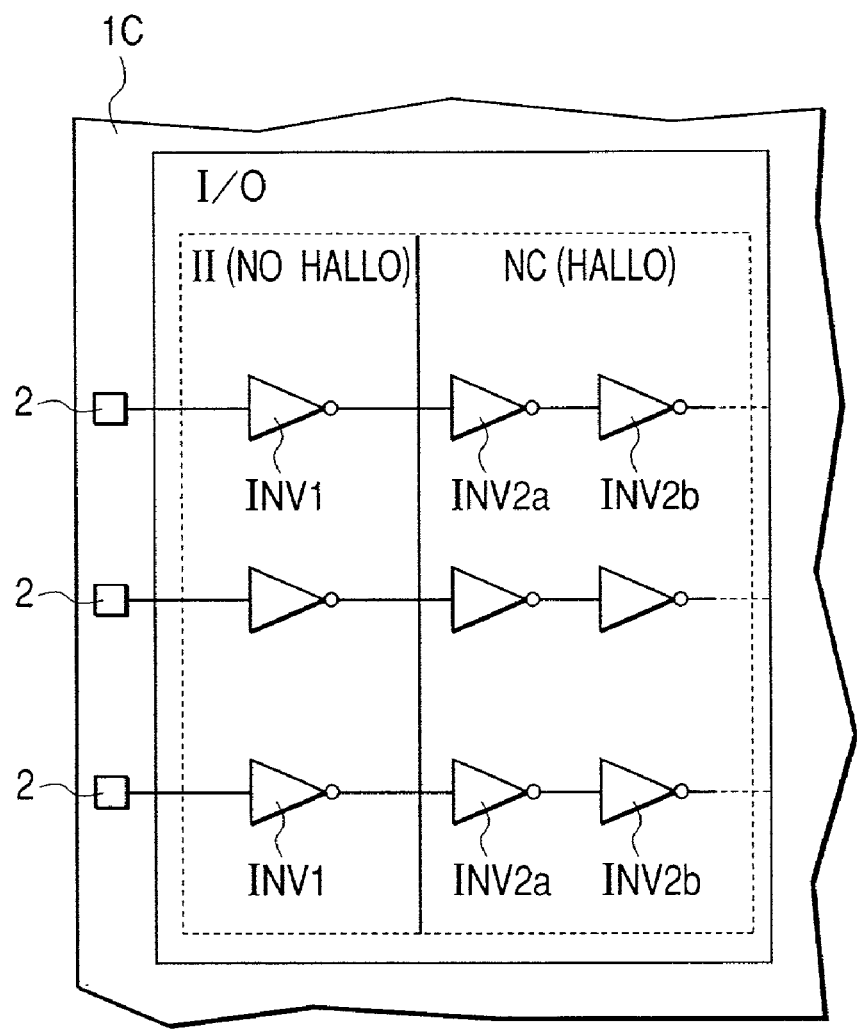
FIG. 1 is a schematic circuit diagram of a semiconductor device representing one embodiment of the present invention.

Prior to the detailed description of the present invention, the meaning of terms employed in the present application will be explained as follows:

1. A wafer indicates a semiconductor substrate, a sapphire substrate, a glass substrate, another insulating, semi-insulating or semiconductor substrate, and a combined substrate thereof, all of which are used in the manufacture of an integrated circuit. The combined substrate includes an epitaxial wafer formed by providing an epitaxial layer on the surface of an SOI (Silicon On Insulator) substrate provided with a device-forming semiconductor layer on an insulating layer, for example, or a semiconductor substrate.

2. As semiconductor devices or semiconductor integrated circuit devices to be described in the present application, ones or the like formed over other insulating substrates, such as glass like TFT (Thin-Film-Transistor) and STN (Super-Twisted Nematic) liquid crystals or the like, will also be included, as well as over a semiconductor or an insulator substrate, such as a silicon wafer, a sapphire substrate or the like, except for a case specified as being not so in particular.

3. A device surface is a main surface of a wafer and indicates a surface over which device patterns corresponding to a plurality of chip regions are formed by lithography.

4. A drain structure of a field effect transistor is a structure for forming the drain of the field effect transistor and includes a semiconductor region for the control or suppression of a channel effect in the present application, in addition to a semiconductor region for the drain thereof.

5. The semiconductor region for the suppression of the short channel effect is also called a pocket region, a punch-through stopper region or a hallo region and indicates a region for suppressing or preventing a leakage current flowing between a semiconductor region for the source of a field effect transistor and a semiconductor region for the drain thereof.

6. An extension region is a region included in the drain structure of the field effect transistor and is also a region which constitutes part of the semiconductor region for the drain. The extension region is disposed so as to adjoin a channel for a field effect transistor. This is also called an LDD (Lightly Doped Drain) region. In general, the extension region is relatively low in impurity concentration in the semiconductor region for the drain.

7. An oxynitride film indicates a film structure in which a predetermined amount of nitrogen exists at the boundary between a semiconductor substrate and a gate insulating film.

8. A surface channel indicates a structure wherein, when a gate voltage is applied to a transistor under circuit operating conditions, a channel current flows through the surface of the semiconductor substrate.

9. Burn In Test: This is a kind of a bias stress test or a high-temperature bias test and is an accelerated test performed while temperature acceleration and field acceleration approximate to an actual use are utilized in combination. This normally indicates a test for applying temperature and voltage stresses to accelerate stresses, thereby removing initially-failed products as a screening process employed in the manufacture of semiconductor devices. The cause of degeneration is accelerated on physical and time bases, and, thereby, the result can be achieved in a short time. As burn-in tests, there may be mentioned, a static burn-in and a dynamic burn-in. The static burn-in is intended to carry out screening, while, under a high temperature of a semiconductor device, a rated voltage or a source voltage exceeding it is applied thereto to allow a current to flow in the semiconductor device, and temperature and voltage stresses are applied to the semiconductor device. The dynamic burn-in is intended to carry out screening, while, under a high temperature of a semiconductor device, a rated voltage or a source voltage exceeding it is applied thereto and a signal approximate to an actual operation is applied to an input circuit of the semiconductor device.

Whenever circumstances require it for convenience in the following embodiments, the subject matter will be described by being divided into a plurality of sections or embodiments. However, unless otherwise specified in particular, they are not irrelevant to one another. One thereof has to do with modifications, details and supplementary explanations of some or all of the other.

When reference is made to a number of elements or the like (including the number of pieces, numerical values, quantity, range, etc.) in the description of the following embodiments, the number thereof is not limited to a specific number and may be greater than or less than or equal to the specific number, unless otherwise specified in particular and definitely limited to the specific number in principle.

It is also needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Those elements having the same function in all the drawings are respectively identified by the same reference numerals and their repetitive description will therefore be omitted.

In the embodiments, a MIS (FET (Metal Insulator Semiconductor Field Effect Transistor) shown as one example of a field effect transistor is abbreviated as "MIS", a p channel type MIS (FRT is abbreviated as "pMIS" and an n channel type MIS (FET is abbreviated as "nMIS".

Preferred embodiments of the present invention will hereinafter be described in detail with reference to the accompanying drawings.

First Embodiment

Prior to the description of the present embodiment, the newly discovered problems, which do not correspond to already-known techniques, among techniques discussed by the present inventors, will be explained.

Figure 23A:
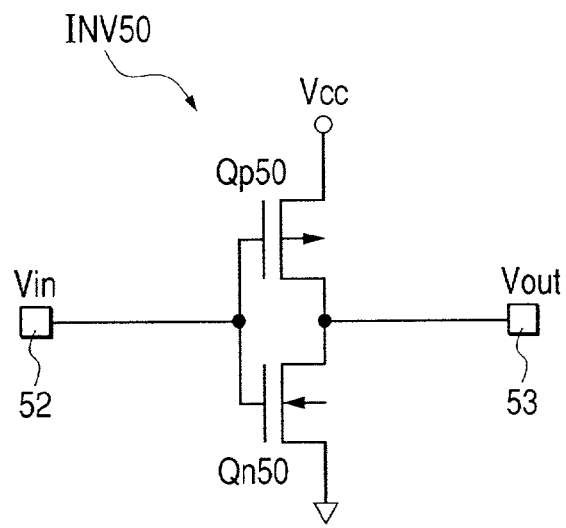
FIG. 23(a) is a schematic circuit diagram and FIG. 23(b) is a graph illustrating the definition of ViL of a CMIS inverter circuit.

The definition of ViL of a CMIS (Complementary MIS) inverter circuit will first be described with reference to FIGS. 23(a) and 23(b). FIG. 23(a) shows an inverter circuit INV50. The inverter circuit INV50 comprises a CMIS inverter circuit which comprises a pMISQp50 and an nMISQn50. An input terminal 52 is connected to the input of the CMIS inverter circuit, and an output terminal 53 is connected to the output thereof. Symbol Vin indicates an input voltage, symbol Vout indicates an output voltage, and symbol Vcc indicates a source voltage on the high potential side.

Figure 23B:
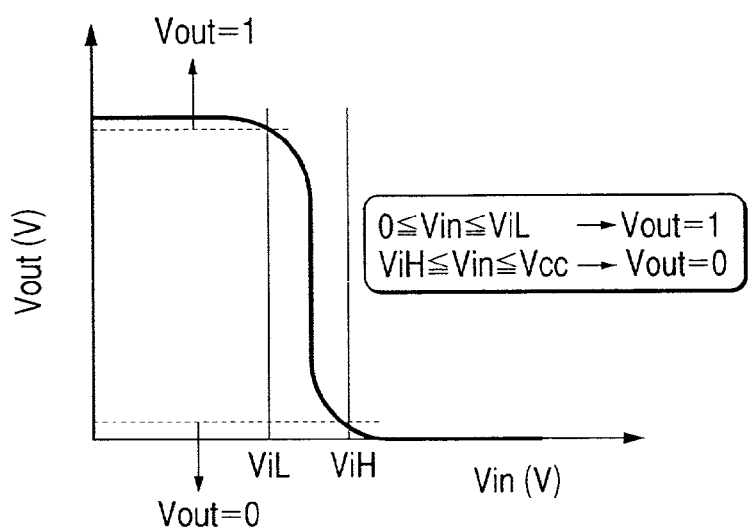

Further, FIG. 23(b) shows an output waveform of the inverter circuit INV50. A voltage ViL in the input voltage Vin indicates the maximum input voltage at which an output of high="1" is obtained. Namely, when the input voltage Vin is given as 0≦Vin≦ViL, the output voltage Vout results in "1". On the other hand, a voltage ViH in the input voltage Vin indicates the minimum input voltage at which an output of low="0" is obtained. When the input voltage Vin is given as ViH≦Vin≦Vcc, the output voltage Vout results in "0".

Figure 24:
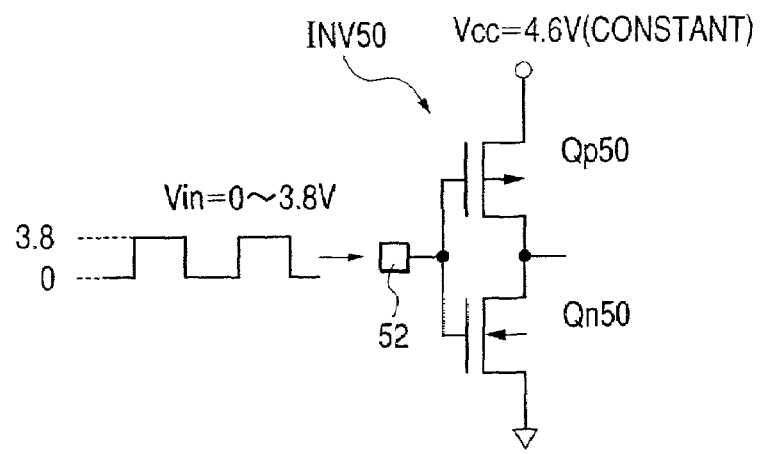
FIG. 24 is a schematic circuit diagram illustrating one example of a burn-in test.
Figure 25:
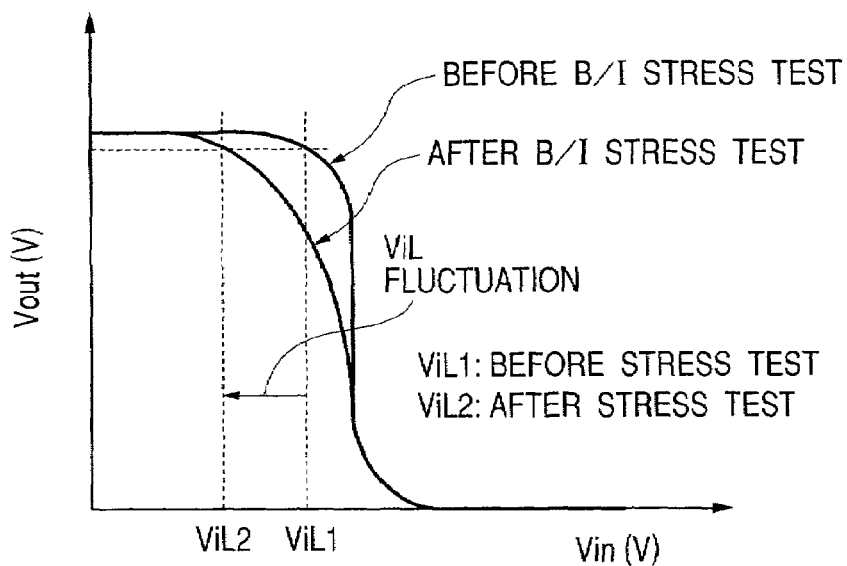
FIG. 25 is a graph showing an output voltage with respect to a voltage inputted to a p channel type MIS (FET prior and posterior to the burn-in test.

FIG. 24 shows one example of a burn-in test. In a state in which a source voltage Vcc of, for example, about 4.6V (constant) has been applied to a power terminal of the inverter circuit INV50, a TTL signal represented in the form of a rectangle whose operating width ranges from 0V to 3.8V, for example, is applied to the input terminal 52 of the inverter circuit INV50, and a TTL operating stress is applied, whereby the burn-in test is carried out. FIG. 25 shows waveforms of output voltages Vout with respect to a voltage Vin inputted to the pMISQp50 before and after the burn-in test. The voltage ViL fluctuates before and after the burn-in test. A voltage ViL1 indicates a voltage ViL prior to the burn-in test, and a voltage ViL2 indicates a voltage ViL subsequent to the burn-in test. This is estimated to result in the degeneration of electrical characteristics (mutual conductance gm and source-to-drain current (drive current) Ids, etc.) of the pMISQp50.

The present inventors have discussed the degeneration of the electrical characteristics of the pMISQp50 under the burn-in test. FIG. 26 shows one example illustrative of stresses effectively applied to the pMISQp50 during the burn-in test.

FIG. 26(a) shows the waveforms of voltages applied to the pMISQp50 during the burn-in test. A waveform indicated by a broken line indicates the waveform of a voltage Vgs applied between the gate and source of the pMISQp50, and a waveform indicated by a solid line indicates the waveform of a voltage Vds applied between the source and drain of the pMISQp50. As shown in FIG. 26(a), a hot carrier (HC) stress and an NBT stress are alternately applied to the pMISQp50 with the elapse of time under an AC operation.

Further, FIGS. 26(b) and 26(c) respectively indicate a hot carrier stress condition and an NBT stress condition applied to the pMISQp50 during the burn-in test. The source and drain of the pMISQp50 are formed in a region of an n well 55 of a semiconductor substrate 54. A semiconductor region 56S for the source of the pMISQp50 and a semiconductor region 56D for the drain thereof respectively have extension regions 56S1 and 56D1 and p$^+$-type semiconductor regions 56S2 and 56D2. The concentration of an impurity introduced into each of the extension regions 56S1 and 56D1 is lower than that of an impurity introduced into each of the p$^+$-type semiconductor regions 56S2 and 56D2. Semiconductor regions (hallow regions) 57 for the suppression of an n-type short channel effect are provided below the extension regions 56S1 and 56D1.

In FIG. 26(b), a gate voltage Vg of about −1.2V is applied to a gate electrode 58, and a drain voltage Vd of about −4.6V is applied to the drain. The n well 55 and the semiconductor region 56S for the source are respectively brought into a state of being electrically connected to a ground potential. In FIG. 26(c), a gate voltage Vg of about −4.6V is applied to the gate electrode, and the n well 55 and the semiconductor regions 56S and 56D for the source and drain are respectively brought into a state of being electrically connected to a ground potential. In either case, hot carriers developed in each channel are stored in the gate electrode 58 side through a gate insulating film 59.

Figure 27A:
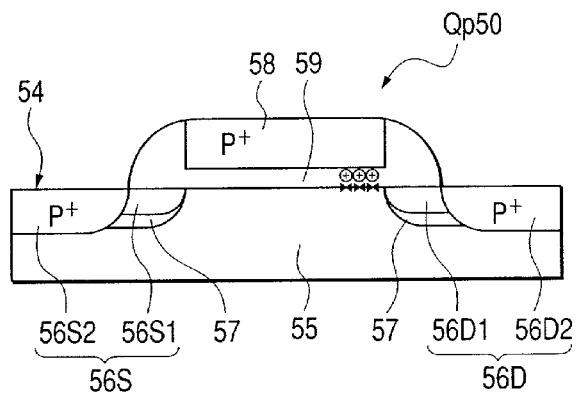
FIGS. 27(a) and 27(b) are diagrams typically showing the number of hole traps at drain terminals in the same hot carrier stress time.
Figure 27B:
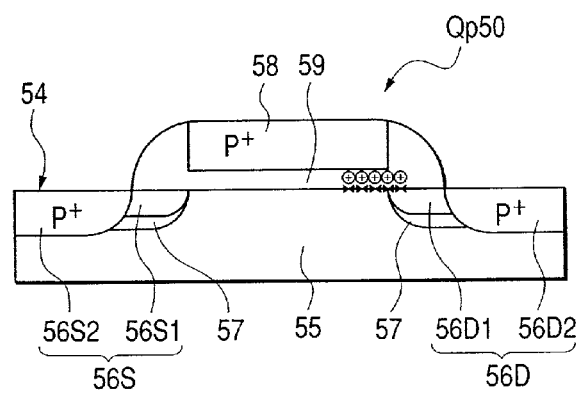
Figure 28:
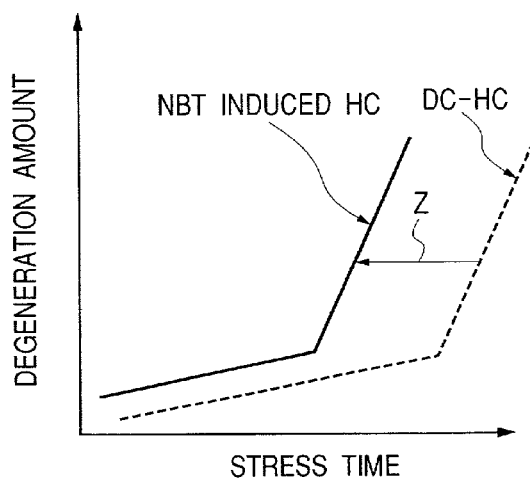
FIG. 28 is a graph showing comparisons between degeneration and their variations with time at a burn-in test.

FIGS. 27(a) and 27(b) typically show the number of hole traps at a drain terminal during the same hot carrier stress time. FIG. 27(a) shows the case in which a signal is applied to the input on a DC basis, and FIG. 27(b) shows the case in which a signal is applied to the input on an AC basis. In the case of the application of the signal thereto on the AC basis, the number of the hole traps increases. FIG. 28 is a graph showing comparisons between degeneration and variations thereof with time at a burn-in test. A solid line indicates the case where an AC-based TTL signal is applied to the input. Further, a broken line shows the case where a DC-based signal is applied to the input. Since an NBT stress condition is applied when the AC-based signal is applied to the input, the amount of degeneration is accelerated with an increase in the number of hole traps. Symbol Z indicates the acceleration of degeneration caused by the increase in the number of hole traps. According to the result of discussions by the present inventors, it has been found that, where an AC-based signal is applied to the input, the life of a semiconductor device is reduced by about one digit as compared with the case where a DC-based signal is applied to the input.

Thus, when an input signal, such as a TTL signal or the like, is directly applied to the input of a pMIS of the input first stage, the NBT stress and the hot carrier stress are alternately applied under an AC operation. Therefore, the degeneration of hot carriers is believed to be further accelerated. As a result, a reduction in the life of the semiconductor device was observed.

Figure 2:
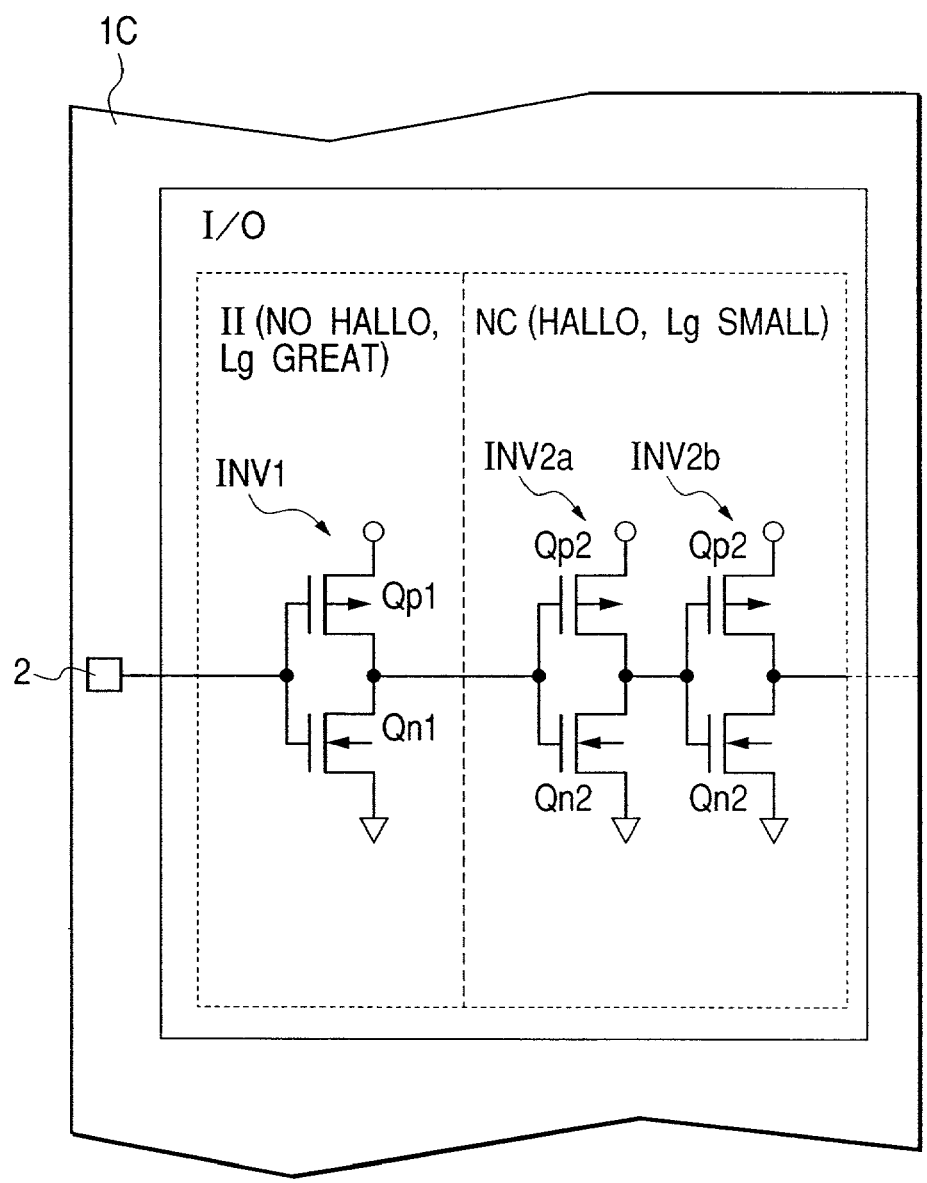
FIG. 2 is a schematic circuit diagram of the semiconductor device at a location similar to FIG. 1.

An embodiment for solving the above-described problems will next be explained. FIGS. 1 and 2 show one example of an input/output circuit region I/O of a semiconductor chip (hereinafter called simply "chip") 1C according to the present embodiment. An input circuit is illustrated in FIGS. 1 and 2 by way of example. FIG. 1 shows inverter circuits INV1, INV2a and INV2b constituting the input circuit, which are represented by logic symbols. FIG. 2 shows the configurations of the inverter circuits INV1, INV2a and INV2b in more detail.

The chip 1C comprises a small piece of a planar quadrangular semiconductor. A configuration wherein a plurality of external terminals 2 are laid out in the neighborhood of the outer periphery of the chip 1C is illustrated here. Of course, the layout of the external terminals 2 is not limited to such an arrangement. A configuration wherein they are laid out in the center of the chip 1C, for example, may be used. Since the input circuit is illustrated here by way of example, the external terminals 2 are illustrated as input external terminals. The external terminals 2 comprise bonding pads or bump electrodes, for example.

The external terminals 2 are electrically connected to their corresponding internal circuits through a plurality of inverter circuits INV1, INV2a, INV2b, . . . connected in series in the input/output circuit region I/O. In the present embodiment, the inverter circuits INV1, to which the external terminals 2 are firstly connected, of the plurality of inverter circuits INV1, INV2a, INV2b, . . . , are called "inverter circuits" of an input first stage II. The subsequent inverter circuits INV2a, INV2b, . . . are called "inverter circuits" of the following stage NC. Incidentally, the input first stage is abbreviated as II below, and ones in the next stage are abbreviated as NC below. Namely, each of the inverter circuits INV1 of the input first stage is a circuit which directly receives a signal inputted from the outside. The subsequent inverter circuits INV2a, INV2b, . . . are circuits which do not receive signals directly from the outside. The subsequent inverter circuits INV2a, INV2b, . . . increase to 10 to 1000 times in number as compared with the first-stage inverter circuit INV1, and hence limitations are imposed on a layout rule or the like. The gate length Lg cannot be increased even for the purpose of maintaining a high-performance characteristic.

Each of these inverter circuits INV1, INV2a, INV2b, comprises a CMIS (Complementary MIS) circuit, for example. The present embodiment illustrates the case where the inverter circuits are driven based on the same operating voltage. In the present embodiment, however, a structure made up of a pMISQp1 and an nMISQn1 (first field effect transistor) constituting the inverter circuit INV1 of the input first stage, and structures each made up of a pMISQp2 and an nMISQn2 (second field effect transistor) constituting each of the inverter circuits INV2a, INV2b, . . . subsequent to the following or next stages are respectively slightly different from one another.

Incidentally, the pMISQp1 and nMISQn1 constituting the inverter circuit INV1 of the input first stage constitute a field effect transistor (MIS (FET) which directly receives an input signal from the outside. A gate electrode 6A thereof is electrically connected to its corresponding external terminal 2. Further, the pMISQp2 and nMISQn2 of the inverter circuits INV2a, INV2b, . . . subsequent to the next stage respectively correspond to field effect transistors (MIS (FETs) which do not receive the input signal directly from the outside.

Firstly, the drain structure of the pMISQp1 and nMISQn1 of the inverter circuit INV1 of the input first stage is not provided with semiconductor regions (hallow regions) for the suppression of a short channel effect, whereas the drain structures of the pMISQp2 and nMISQn2 of the inverter circuits INV2a, INV2b, . . . have no semiconductor regions (hallow regions) for the suppression of the short channel effects.

Secondly, the gate lengths Lg of the pMISQp1 and nMISQn1 of the inverter circuit INV1 of the input first stage are longer than those of the pMISQp2 and nMISQn2 of the inverter circuits INV2a, INV2b, . . . subsequent thereto in the next stage.

Owing to the non-provision of the semiconductor regions (hallow regions) for the suppression of the short channel effect for the drain structure of the pMISQp1 and nMISQn1 of the inverter circuit INV1 of the input first stage in this way, the pMISQp1 and nMISQn1 (pMISQp1 in particular) constituting the inverter circuit INV1 of the input first stage allows a relaxation of internal field strengths lying in the neighborhood of their drains. It is therefore possible to avoid the problem concerning the hot carriers developed in the MISs of the input first stage, which has been newly discovered by the present inventors, and to improve the resistance to the hot carriers. Since the gate lengths Lg of the pMISQp2 and nMISQn2 constituting the inverter circuit INV1 of the input first stage are ensured to be long to some extent, the short channel effect can be suppressed or prevented from occurring. From these viewpoints, the reliability and life of the semiconductor device can be improved. Incidentally, since the signals for the TTL operation, etc. are not directly inputted to the pMISQp2 and nMISQn2 of the inverter circuits in the next stage, the resistance to the hot carriers is high as compared with the inverter circuit INV1 of the input first stage, and no problem occurs even if the semiconductor regions for the suppression of the short channel effect are provided.

Further, the above-described effect can be implemented without incurring an increase in chip size and a reduction in performance. For example, the gate lengths are considered even to make long without providing the semiconductor regions for the suppression of the short channel effect at the pMISQp2 and nMISQn2 of the inverter circuits INV2a, INV2b, . . . in the next stage. Doing so yields an increase in chip size because the inverter circuits INV2a, INV2b, . . . in the next stage increase to 10 to 1000 times in number as compared with the inverter circuit INV1 of the input first stage and the layout rule or the like is restricted, as described above. Further, the pMISQp2 and nMISQn2 of the inverter circuits INV2a, INV2b, . . . subsequent to the next stage need to maintain their high-performance characteristics. However, when their gate lengths are made long, the high-performance characteristics thereof cannot be maintained. Since such a problem does not arise in the present embodiment, the hot-carrier problem discovered by the present inventors can be avoided without incurring an increase in chip size and a reduction in performance, thus making it possible to improve the reliability and life of the semiconductor device.

Incidentally, the external terminals 2 are normally electrically connected to corresponding leads of a package through bonding wires or bump electrodes (protruded electrodes) connected thereto in the state of being in direct contact therewith. Further, the external terminals 2 are electrically connected to their corresponding outputs of an external device (or external circuit) provided outside the chip 1C, through wirings on a wiring board for mounting the package.

Figure 3:
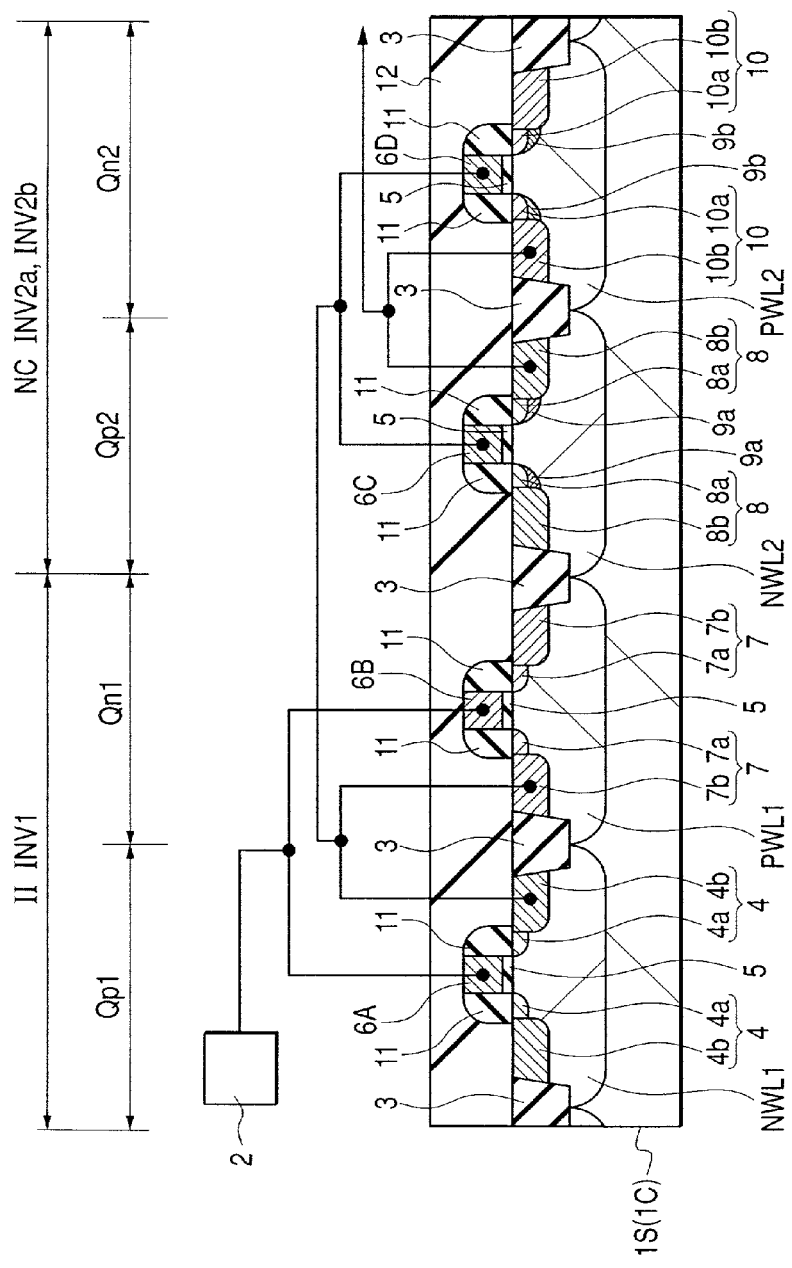
FIG. 3 is a fragmentary cross-sectional view of the semiconductor device shown in FIG. 1.

FIG. 3 shows one example of a fragmentary sectional view illustrative of the inverter circuit INV1 of the input first stage and the inverter circuit INV2a of the next stage.

A semiconductor substrate (hereinafter called simply "substrate") that constitutes the chip 1C, comprises p-type monocrystal silicon, for example. Semiconductor regions called n wells NWL1 and NWL2 and p wells PWL1 and PWL2 are formed over a predetermined depth as viewed from a main surface (device surface) thereof. An n-type region forming impurity such as phosphor (P) or arsenic (As) or the like is introduced into the n wells NWL1 and NWL2, whereas a p-type region forming impurity such as boron (B) or the like is introduced into the p wells PWL1 and PWL2.

For example, trench isolations 3 are formed in isolation regions of the main surface of the substrate 1S. The isolations 3 are formed by embedding an insulating film like, for example, silicon oxide or the like within trenches dug to a predetermined depth from the main surface of the substrate 1S. The isolations 3 are not limited to the trench isolations 3 and may be changed in various ways. They may be formed as a field insulating film which comprises silicon oxide or the like formed by a LOCOS (Local Oxidization of Silicon) method.

The pMISQp1 and nMISQn1 of the inverter circuit INV1 of the input first stage, and the pMISQp2 and pMISQn2 of the inverter circuits INV2a and INV2b of the next stage are formed in their corresponding active regions for the n wells NWL1 and NWL2 and p wells PWL1 and PWL2 surrounded by the isolations 3.

The pMISQp1, which constitutes the inverter circuit INV1 of the input first stage, has a pair of semiconductor regions 4 for the source and drain thereof, a gate insulating film 5 and a gate electrode 6A. A channel for the pMISQp1 is formed in a boundary portion between the gate insulating film 5 and the substrate 1S below the gate electrode 6A on the substrate 1S between the pair of semiconductor regions 4, for example (surface channel). The gate length of the pMISQp1 is about 0.5 µm, for example.

The semiconductor region 4 has an extension region 4a and a $^{p+}$-type semiconductor region 4b. The extension regions 4a are disposed so as to adjoin the channel for the pMISQp1. The $^{p+}$-type semiconductor region 4b is placed in a position spaced from the channel by the extension region 4a. For example, boron for forming the same conduction type semiconductor region is introduced into the extension regions 4a and the $^{p+}$-type semiconductor regions 4b. However, the extension region 4a is set so as to become lower than the p$^+$-type semiconductor region 4b in impurity concentration. The extension region 4a has the function of connecting the channel and the p$^+$-type semiconductor region 4b and the function of controlling or suppressing the occurrence of hot carriers. As described above, the drain structure of the pMISQp of the input first stage is not provided with semiconductor regions (hallo regions) for the suppression of the short channel effect.

The gate insulating film 5 comprises a silicon oxide film, for example. The gate insulating film 5 may be formed as an oxynitride film. It is thus possible to improve the resistance to hot carriers. It is also possible to suppress or prevent a phenomenon in which an impurity like boron or the like introduced into the gate electrode 6A is allowed to pass through the gate insulating film 5 so as to diffuse into the substrate 1S.

The gate electrode 6A comprises p-type low-resistance polysilicon, for example. For example, boron is introduced into the gate electrode 6A. The gate electrode 6A is electrically connected to its corresponding external terminal 2 through a wiring. The gate electrode 6A is not limited to the single film of low-resistance polysilicon and various changes may be made thereto. The gate electrode 6A may take on a so-called polyside gate structure wherein cobalt silicide (CoSix) is formed on a p-type low-resistance film, for example. Titanium silicide (TiSix) or tungsten silicide (WSix) may be adopted in place of the cobalt silicide. However, the cobalt silicide rather than such silicide can be reduced in resistance. The gate electrode 6A may be formed as a so-called polymetal gate structure wherein a tungsten (W) film is deposited on the p-type low-resistance polysilicon film with a barrier film like titanium nitride (WN) or the like interposed therebetween. In this case, the resistance of the gate electrode 6A and the contact resistance between the gate electrode 6A and each wiring can reduced significantly.

The nMISQn1 constituting the inverter circuit INV1 of the input first stage has a pair of semiconductor regions 7 for the source and drain thereof, a gate insulating film 5 and a gate electrode 6B. A channel for the pMISQn1 is formed in a boundary portion between the gate insulating film 5 and the substrate 1S below the gate electrode 6B on the substrate 1S between the pair of semiconductor regions 7, for example (surface channel). The gate length of the nMISQn1 is about 0.5 µm, for example.

The semiconductor region 7 has an extension region 7a and an n$^+$-type semiconductor region 7b. The extension regions 7a are disposed so as to adjoin the channel for the nMISQn1. The n$^+$-type semiconductor region 7b is placed in a position spaced away from the channel by the extension region 7a. Phosphor or arsenic for forming the same conduction type semiconductor region is introduced into the extension regions 7a and the n$^+$-type semiconductor regions 7b. However, the extension region 7a is set so as to become lower than the n$^+$-type semiconductor region 7b in impurity concentration. The extension region 7a has the function of connecting the channel and the n$^+$-type semiconductor region 7b and the function of controlling or suppressing the occurrence of hot carriers. As described above, the drain structure of the nMISQn of the input first stage is not provided with the semiconductor regions (hallo regions) for the suppression of the short channel effect.

The gate electrode 6B comprises n-type low-resistance polysilicon, for example. For example, phosphor or arsenic is introduced into the gate electrode 6B. The gate electrode 6B is electrically connected to the external terminal 2 and the gate electrode 6A of the pMISQp1 through wirings. The gate electrode 6B may take on a polyside gate structure or polymetal gate structure in a manner similar to the gate electrode 6A. In this case, a low-resistance polysilicon film corresponding to the outermost layer is defined as an n type.

Each of the pMISQp2 constituting the inverter circuits INV2a and INV2b of the next stage has a pair of semiconductor regions 8 for the source and drain thereof, a gate insulating film 5 and a gate electrode 6C. A channel for the pMISQp2 is formed in a boundary portion between the gate insulating film 5 and the substrate 1S below the gate electrode 6C on the substrate 1S between the pair of semiconductor regions 8, for example (surface channel). The gate length of the pMISQp2 is about 0.4 µm, for example.

The semiconductor region 8 has an extension region 8a and a p$^+$-type semiconductor region 8b. The extension regions 8a are disposed so as to adjoin the channel for the pMISQp2. The p$^+$-type semiconductor region 8b is placed in a position spaced away from the channel by the extension region 8a. For example, boron for forming the same conduction type semiconductor region is introduced into the extension regions 8a and the p$^+$-type semiconductor regions 8b. However, the extension region 8a is set so as to become lower than the p$^+$-type semiconductor region 8b in impurity concentration. The extension region 8a has the function of connecting the channel and the p$^+$-type semiconductor region 8b and the function of controlling or suppressing the occurrence of hot carriers. The impurity concentration of each extension region 8a is approximately equal to that of each extension region 4a of the pMISQp1 of the input first stage. Thus, since a channel resistance of the pMISQp1 of the input first stage can be made approximately identical to that of the next-stage pMISQp2, a drive current for the pMISQp1 can be improved and the operating speed of the pMISQp1 can be enhanced.

As described above, a drain structure for each pMISQp2 of the next stage has semiconductor regions (hallo regions) 9a for the suppression of the short channel effect. For example, an impurity like phosphor or arsenic or the like is introduced into the semiconductor regions 9a for the suppression of the short channel effect. The semiconductor regions 9a comprise n-type semiconductor regions of conduction types opposite to that of the pair of semiconductor regions 8 for the source and drain. Each of the semiconductor regions 9a is partly provided so that the position of the peak of impurity concentration of each semiconductor region is placed below the extension region 8a. The impurity concentration of each semiconductor region 9a for the suppression of the short channel effect is set higher than that of the n well NWL2.

The provision of the semiconductor regions 9a for the suppression of the short channel effect in this way allows suppression or prevention of the short channel effect of the pMISQp2. The gate electrode 6C is electrically connected to the output (corresponding to the semiconductor region of the pMISQp1 and the semiconductor region 7 of the nMISQn1) of the inverter circuit INV1 of the input first stage through wirings. Incidentally, since the structure of the gate electrode 6C is identical to the gate electrode 6A of the pMISQp1 of the input first stage, the description thereof will be omitted.

Each of the nMISQn2 constituting the inverter circuits INV2a and INV2b of the next stage has a pair of semiconductor regions 10 for the source and drain, a gate insulating film 5, and a gate electrode 6D. A channel for the nMISQn2 is formed in a boundary portion between a gate insulating film 5 and the substrate 1S below the gate electrode 6D on the substrate 1S between the pair of semiconductor regions 10, for example (surface channel). The gate length of the pMISQn2 is about 0.4 µm, for example.

The semiconductor region 10 has an extension region 10a and an n⁺-type semiconductor region 10b. The extension regions 10a are disposed so as to adjoin the channel for the nMISQn2. The n⁺-type semiconductor region 10b is placed in a position spaced away from the channel by the extension region 10a. For example, phosphor or arsenic for forming the same conduction type semiconductor region is introduced into the extension regions 10a and the n⁺-type semiconductor regions 10b. However, the extension region 10a is set so as to become lower than the n⁺-type semiconductor region 10b in impurity concentration. The extension region 10a has the function of connecting the channel and the n⁺-type semiconductor region 10b and the function of controlling or suppressing the occurrence of hot carriers. The impurity concentration of each extension region 10a is approximately equal to that of each extension region 7a of the nMISQn1 of the input first stage. Thus, since a channel resistance of the nMISQn1 of the input first stage can be made approximately identical to that of the next-stage nMISQn2, the drive current for the nMISQn1 can be improved and the operating speed of the nMISQn1 can be enhanced.

As described above, a drain structure of each nMISQn2 in the next stage has semiconductor regions (hallo regions) 9b for the suppression of the short channel effect. For example, an impurity like boron or the like is introduced into the semiconductor regions 9b for the suppression of the short channel effect. The semiconductor regions 9b comprise p-type semiconductor regions of conduction types opposite to the pair of semiconductor regions 10 for the source and drain. Each of the semiconductor regions 9b is partly provided so that the position of the peak of impurity concentration of each semiconductor region is placed below the extension region 10a. The impurity concentration of each semiconductor region 9b for the suppression of the short channel effect is set higher than that of the p well PWL2.

The provision of the semiconductor regions 9b for the suppression of the short channel effect in this way allows suppression or prevention of the short channel effect of the nMISQn2. The gate electrode 6D is electrically connected to the gate electrode 6C of the pMISQp2 and the output (corresponding to the semiconductor region 4 of the pMISQp1 and the semiconductor region 7 of the nMISQn1) of the inverter circuit INV1 of the input first stage through wirings. Incidentally, since the structure of the gate electrode 6D is identical to the gate electrode 6B of the nMISQn1 of the input first stage, the description thereof will be omitted.

Sidewalls 11 formed of, for example, a silicon oxide film are formed on their corresponding gate electrodes 6A through 6D of pMISQp1 and pMISQp2 and nMISQn1 and nMISQn2. An interlayer dielectric or insulator 12, which comprises, for example, silicon oxide, is deposited on the main surface of the substrate 1S.

Figure 4:
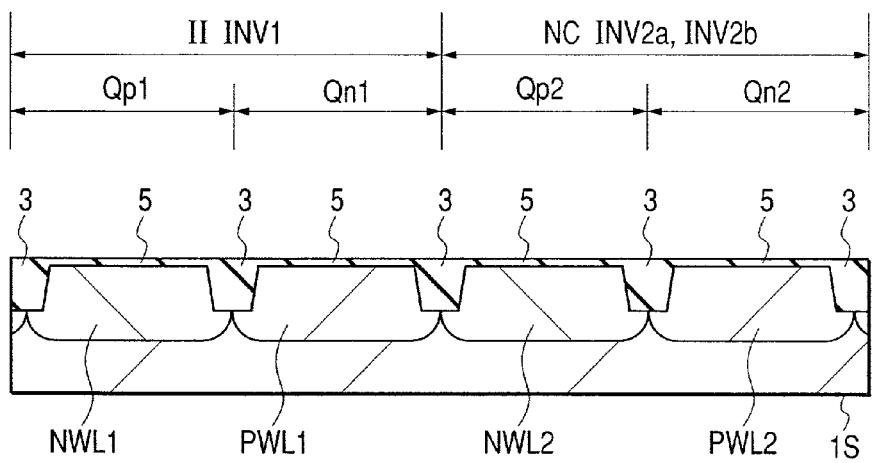
FIG. 4 is a fragmentary cross-sectional view of the semiconductor device shown in FIG. 1, during a step in the manufacturing process thereof.

A method of manufacturing a semiconductor device according to the present embodiment will next be described with reference to FIGS. 4 through 13. FIG. 4 is a fragmentary cross-sectional view of the semiconductor device during a step of its manufacturing process. In this stage, the substrate 1S is formed as a plane circular wafer, for example. n wells NWL1 and NWL2 and p wells PWL1 and PWL2 have already been formed on the substrate 1S. Trench isolations 3 are defined in their corresponding isolation regions of the main surface of the substrate 1S. A gate insulating film 5 comprised of, for example, a silicon oxide film is formed in active regions each surrounded by the isolations 3. When it is desired to form the gate insulating film 5, of oxynitride, for example, it is obtained by subjecting the substrate 1S to heat treatment in an atmosphere of, for example, NO (nitric oxide) or N₂O (nitrogen monoxide) or the like, after the formation of the gate insulating film made up of, for example, a silicon oxide film and segregating nitrogen in an interface between the gate insulating film 5 and the substrate 1S (oxynitride film). Consequently, hot carriers can be suppressed, and the reliability of the extra-thin gate insulating film 5 can be enhanced. The method of forming the oxynitride film is not limited to the above method and can be changed in various ways. After the formation of a gate insulating film, which comprises a silicon oxide film, for example, nitrogen is implanted therein by an ion implantation method, followed by heat treatment thereof, whereby nitrogen may be segregated in the interface between the gate insulating film 5 and the semiconductor substrate 1S.

Figure 5:
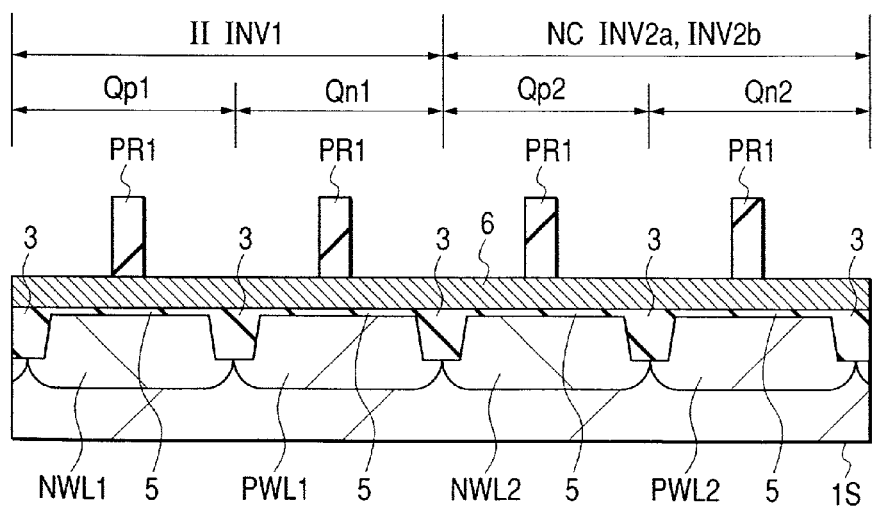
FIG. 5 is a fragmentary cross-sectional view of the semiconductor device, following FIG. 4, during a step of its manufacturing process.

In such a substrate 1S, a gate electrode forming film 6 formed of, for example, polysilicon is first deposited on the main surface of the substrate 1S by a CVD method or the like, as shown in FIG. 5. Afterwards, for example, boron is ion-implanted in regions for forming pMISQp1 and pMISQp2 in the gate electrode forming film 6, and, for example, phosphor or arsenic is ion-implanted in regions for forming nMISQn1 and nMISQn2. Thus, the pMIS forming regions lying in the gate electrode forming film 6 are defined as p types and nMIS forming regions lying therein are defined as n types. Thereafter, photoresist patterns (hereinafter called simply "resist patterns") PR1 for the formation of gate electrodes are formed on the gate electrode forming film 6.

Figure 6:
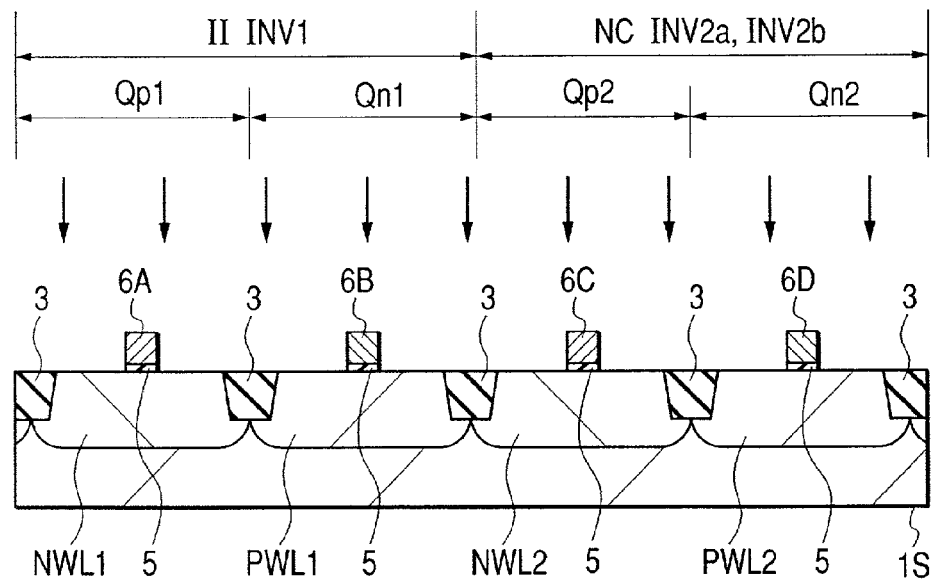
FIG. 6 is a fragmentary cross-sectional view of the semiconductor device following FIG. 5, during a step of its manufacturing process.
Figure 7:
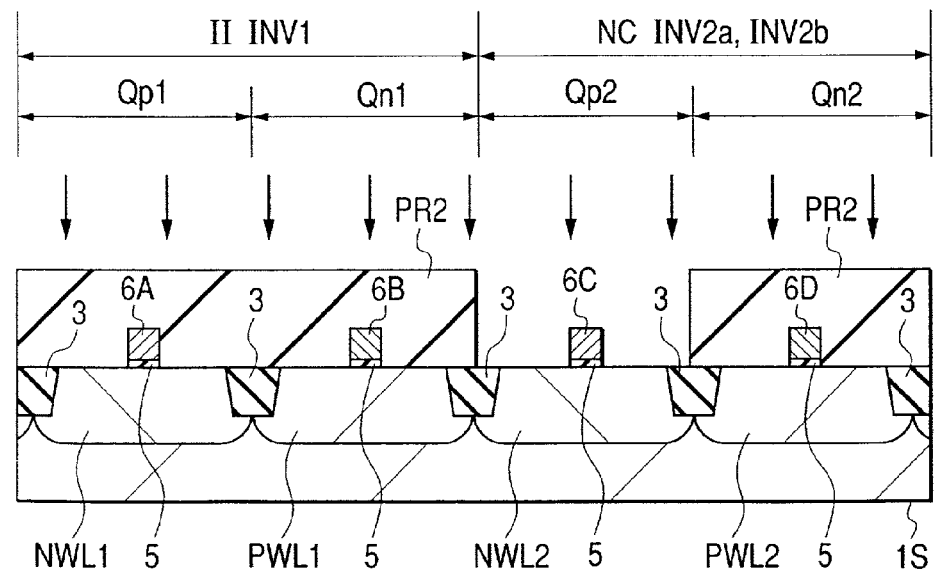
FIG. 7 is a fragmentary cross-sectional view of the semiconductor device, following FIG. 6, during a step of its manufacturing process.

Next, the resist patterns PR1 are used as etching masks, and the gate electrode forming films 6 exposed therefrom are removed, by etching, whereby gate electrodes 6A through 6D are formed as shown in FIG. 6. Thereafter, as shown in FIG. 7, such resist patterns PR2 that the pMISQp2 forming regions of the next stage are exposed and the regions other than those are covered therewith, are formed on the main surface of the substrate 1S. Afterwards, boron difluoride (BF$_2$), for example, is implanted in the substrate 1S by the ion implantation method using the resist patterns PR2 as masks to form the extension regions 8a (see FIG. 3) of the pMISQp2. As a condition at this time, the energy to be implanted ranges from about 1 keV to about 30 keV, for example, and the dose ranges from about $1\times10^{13}/cm^2$ to about $1\times10^{15}/cm^2$, for example. Subsequently, phosphor, for example, is implanted in the substrate 1S by the ion implantation method using the resist patterns PR2 as masks to form the semiconductor regions 9a (see FIG. 3) for the suppression of the short channel effect, of the pMISQp2. As a condition at this time, the energy to be implanted ranges from about 10 keV to about 100 keV, for example, and the dose ranges from about $1\times10^{13}/cm^2$ to about $1\times10^{14}/cm^2$, for example.

Figure 8:
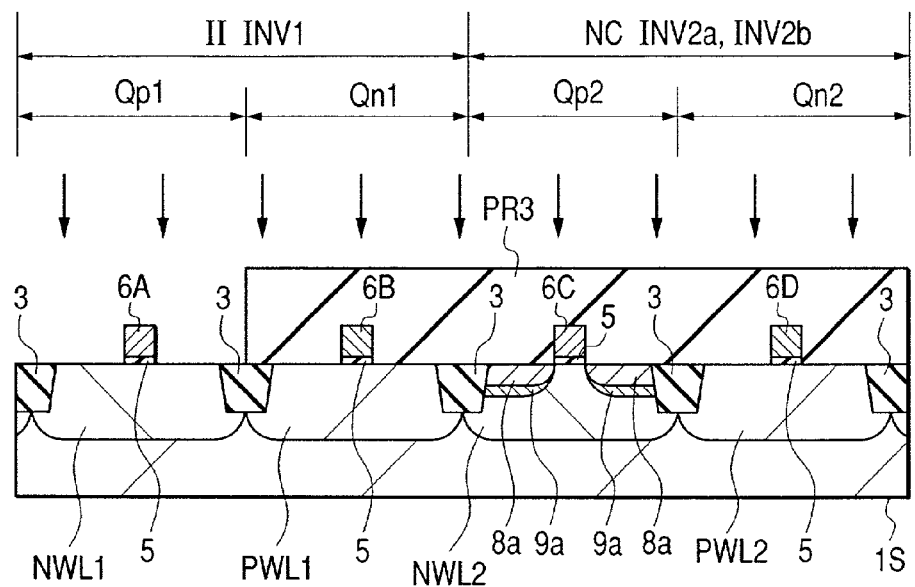
FIG. 8 is a fragmentary cross-sectional view of the semiconductor device, following FIG. 7, during a step of its manufacturing process.

Next, the resist patterns PR2 are removed. Thereafter, such a resist pattern PR3 that the region for forming the pMISQp1 of the input first stage is exposed and the regions other than it are covered therewith, is formed on the main surface of the substrate 1S, as shown in FIG. 8. Afterwards, boron fluoride (BF2), for example, is implanted in the substrate 1S by the ion implantation method using the resist pattern PR3 as a mask to form the extension regions 4a (see FIG. 3) of the pMISQp1. A condition at this time is identical to the condition at the time that the extension regions 8a of the pMISQp2 of the next stage are formed.

Figure 9:
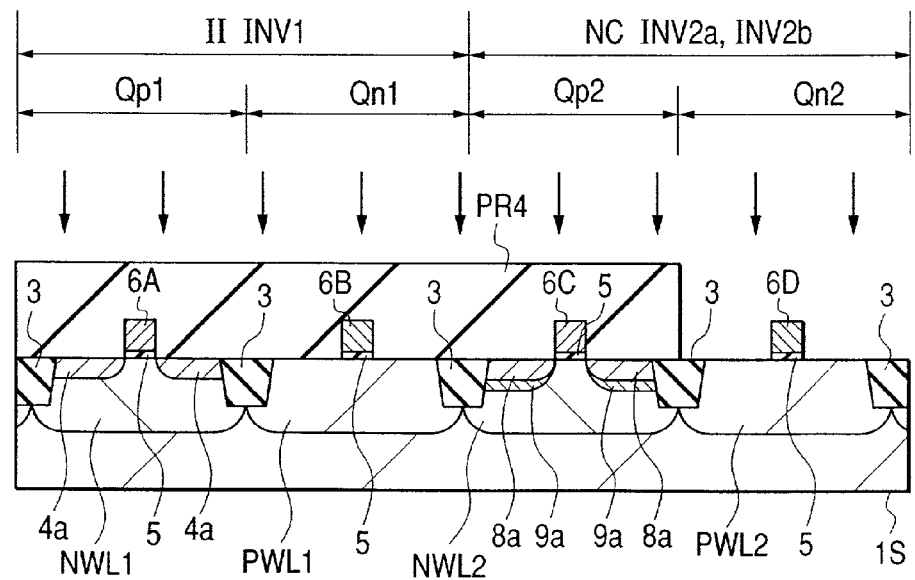
FIG. 9 is a fragmentary cross-sectional view of the semiconductor device, following FIG. 8, during a step of its manufacturing process.

Next, the resist pattern PR3 is removed. Thereafter, such a resist pattern PR4 that the region for forming each of the nMISQn2 of the next stage is exposed and the regions other than it are covered therewith, is formed on the main surface of the substrate 1S, as shown in FIG. 9. Afterwards, arsenic (As) or phosphor (P), for example, is implanted in the substrate 1S by the ion implantation method using the resist pattern PR4 as a mask to form the extension regions 10a (see FIG. 3) of the nMISQn2. As a condition at this time, the energy to be implanted ranges from about 1 keV to about 30 keV, for example, and the dose ranges from about $1\times10^{13}/cm^2$ to about $1\times10^{15}/cm^2$, for example. Subsequently, boron (B) or boron difluoride (BF2), for example, is implanted in the substrate 1S by the ion implantation method using the resist pattern PR4 as a mask to form the semiconductor regions 9b (see FIG. 3) for the suppression of the short channel effect, of the nMISQn2. As a condition at this time, the energy to be implanted ranges from about 10 keV to about 100 keV, for example, and the dose ranges from about $1\times10^{13}/cm^2$ to about $1\times10^{15}/cm^2$, for example.

Figure 10:
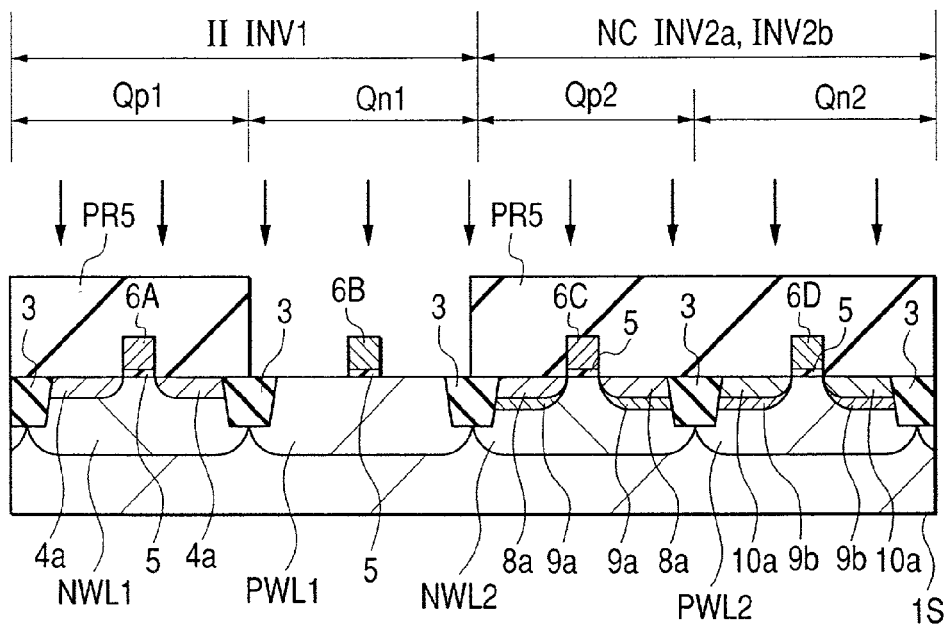
FIG. 10 is a fragmentary cross-sectional view of the semiconductor device following FIG. 9, during a step of its manufacturing process.

Next, the resist pattern PR4 is removed. Thereafter, such resist patterns PR5 that the region for forming the nMISQn1 of the input first stage is exposed and the regions other than it are covered therewith, are formed on the main surface of the substrate 1S, as shown in FIG. 10. Afterwards, arsenic (As) or phosphor (P), for example, is implanted in the substrate 1S by the ion implantation method using the resist patterns PR5 as masks to form the extension regions 7a (see FIG. 3) of the nMISQn1. A condition at this time is identical to the condition at the time that the extension regions 10a of the nMISQn2 subsequent to the next stage are formed.

Figure 11:
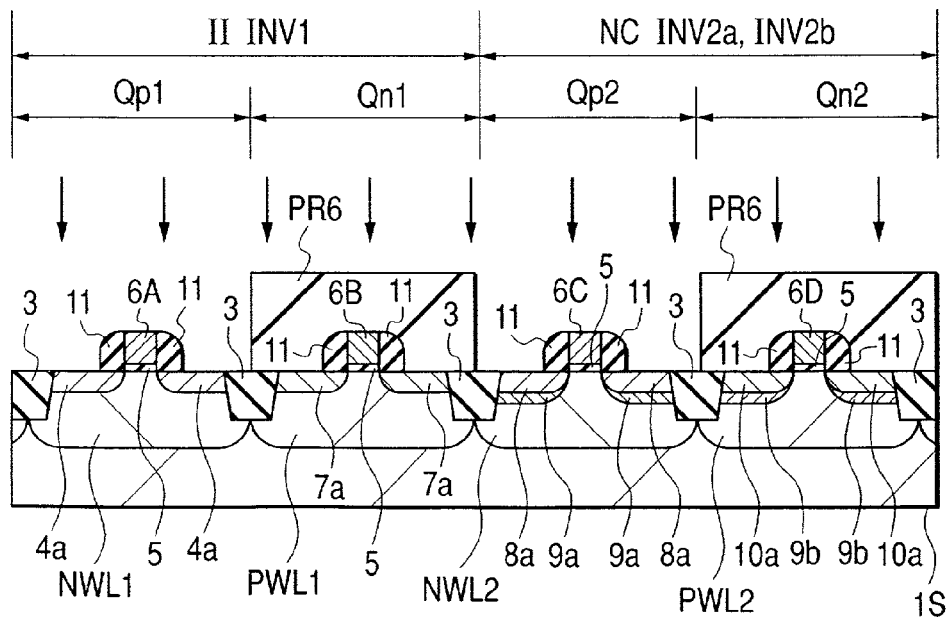
FIG. 11 is a fragmentary cross-sectional view of the semiconductor device, following FIG. 10, during a step of its manufacturing process.

Next, the resist patterns PR5 are removed. Thereafter, an insulating film made of, for example, silicon oxide is deposited on the main surface of the substrate 1S, followed by etchback thereof, whereby sidewalls 11 whose thickness ranges from about 50 nm to about 200 nm, for example, are formed on corresponding sides of the gate electrodes 6A through 6D, as shown in FIG. 11. Afterwards, such resist patterns PR6 that the pMISQp1 and pMISQp2 forming regions are exposed and the regions other than those are covered therewith, are formed on the main surface of the substrate 1S. Afterwards, boron (B) or boron difluoride (BF$_2$), for example, is implanted in the substrate 1S by the ion implantation method using the resist pattern PR6 as a mask to form the p$^+$-type semiconductor regions 4b and 8b (see FIG. 3). As a condition at this time, the energy to be implanted ranges from about 10 keV to about 100 keV, for example, and the dose ranges from about $1\times10^{13}/cm^2$ to about $5\times10^{15}/cm^2$, for example.

Figure 12:
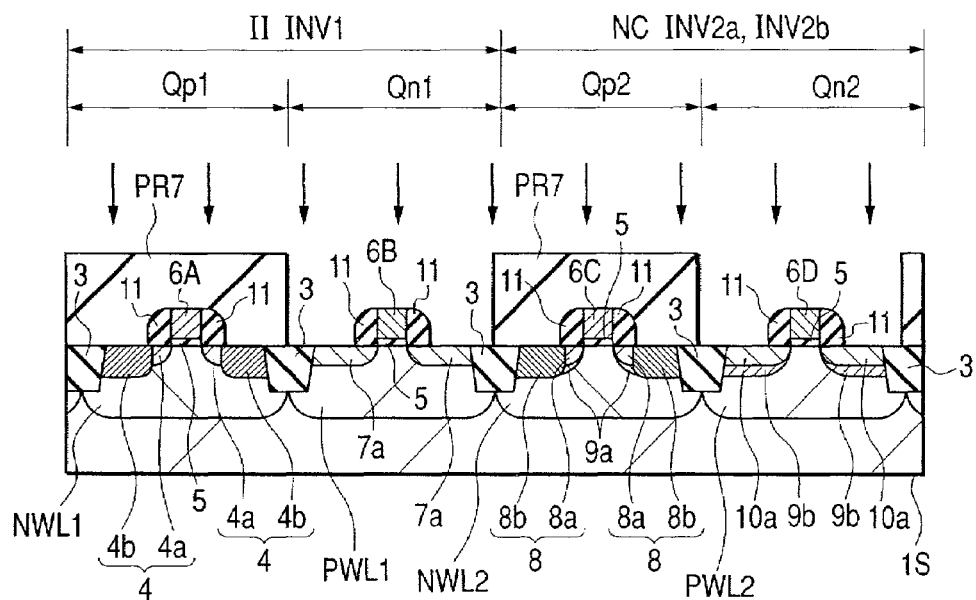
FIG. 12 is a fragmentary cross-sectional view of the semiconductor device following FIG. 11, during a step of its manufacturing process.

Next, the resist patterns PR6 are removed. Thereafter, such resist patterns PR7 that the nMISQn1 and nMISQn2 forming regions are exposed and the regions other than those are covered therewith, are formed on the main surface of the substrate 1S, as shown in FIG. 12. Afterwards, arsenic (As) or phosphor (P), for example, is injected into the substrate 1S by the ion implantation method using the resist patterns PR7 as masks to form the n$^+$-type semiconductor regions 7b and 10b (see FIG. 3). As a condition at this time, the energy to be implanted ranges from about 10 keV to about 100 keV, for example, and the dose ranges from about $5\times10^{13}/cm^2$ to about $5\times10^{15}/cm^2$, for example.

Figure 13:
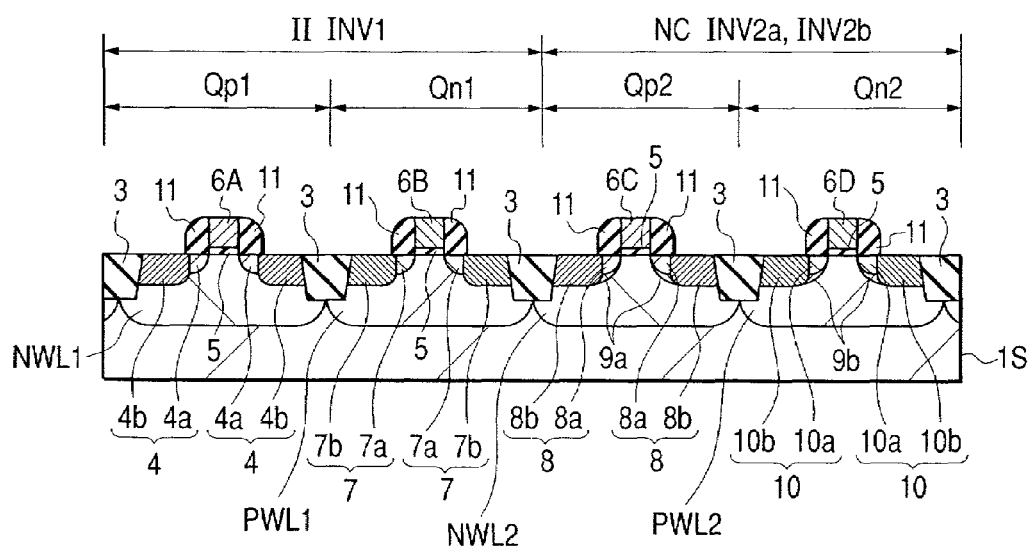
FIG. 13 is a fragmentary cross-sectional view of the semiconductor device following FIG. 12, during a step of its manufacturing process.

Thereafter, the resist patterns PR7 are removed to form drain structures for the pMISQp1 and pMISQp2 and nMISQn1 and nMISQn2, as shown in FIG. 13. While the drain structures for the pMISQp1 and pMISQp2 have been formed previously in the manufacturing method referred to above, the drain structures for the nMISQn1 and nMISQn2 may be formed first.

Afterwards, an interlayer dielectric or insulator 12 made of silicon oxide, for example, is deposited on the main surface of the substrate 1S by the CVD method or the like. Thereafter, the external terminals 2 are formed via the normal process for forming semiconductor device wirings, and the semiconductor device shown in FIG. 3 or the like is completed.

Second Embodiment

Figure 14:
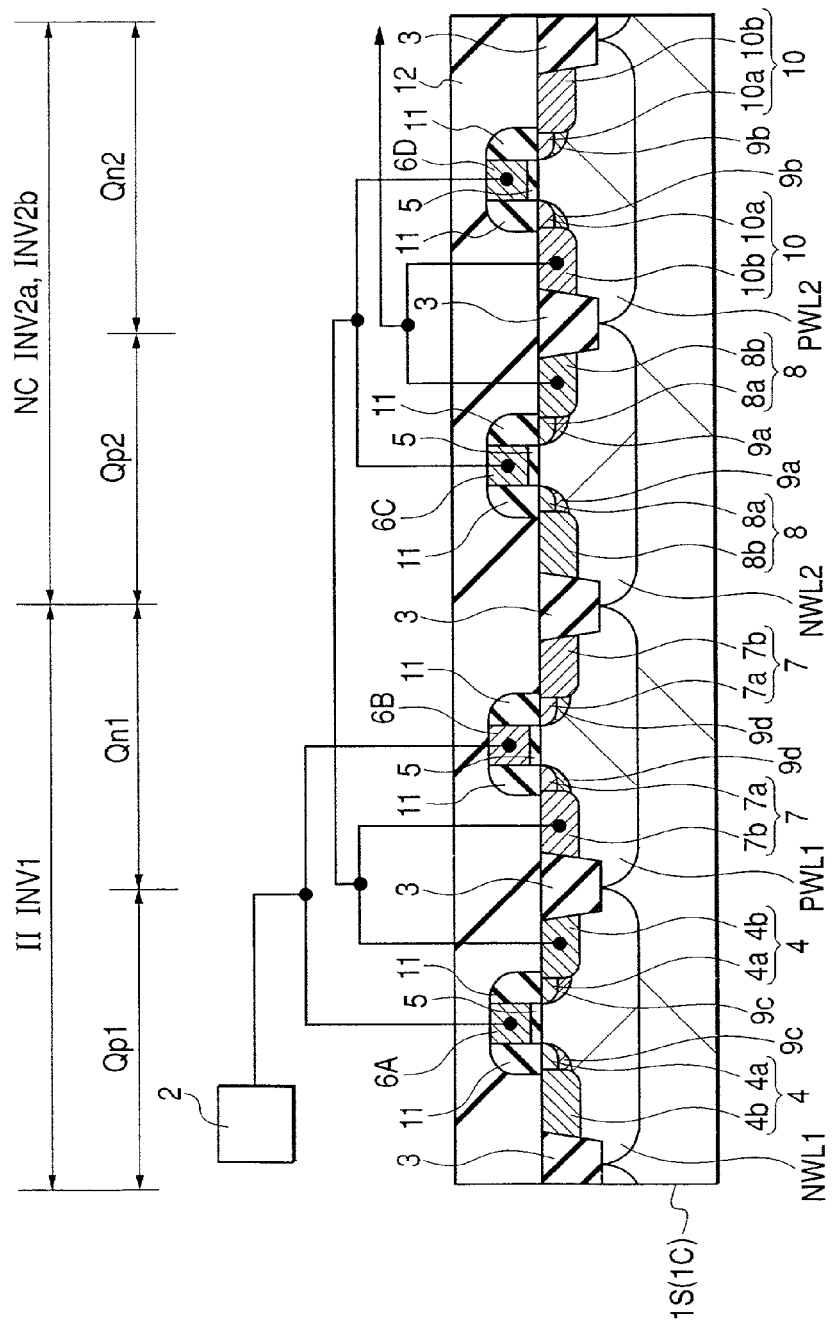
FIG. 14 is a fragmentary cross-sectional view of a semiconductor device according to another embodiment of the present invention.

FIG. 14 shows as one example a fragmentary cross-sectional view of a semiconductor device which represents another embodiment of the present invention and is at the same place as FIG. 3.

In the present embodiment, a drain structure of pMISQp1 and nMISQn1 of an input first stage has semiconductor regions 9c and 9d each of which is used for the suppression of a short channel effect.

For example, phosphor (P) or arsenic (As) is introduced into the semiconductor regions 9c for the suppression of the short channel effect, of the pMISQp1. The semiconductor regions 9c comprise n-type semiconductor regions of conduction types opposite to that of a pair of semiconductor regions 4 for a source and a drain. The semiconductor region 9c for the suppression of the short channel effect is partly provided so that the peak of impurity concentration thereof is placed below its corresponding extension region 4a.

For example, boron (B) is introduced into semiconductor regions 9d for the suppression of a short channel effect of the nMISQn1. The semiconductor regions 9d comprise p-type semiconductor regions of conduction types opposite to that of a pair of semiconductor regions 7 for a source and a drain. Each of the semiconductor regions 9d for the suppression of the short channel effect is partly provided so that the peak of impurity concentration thereof is placed below its corresponding extension region 7a.

Owing to such semiconductor regions 9c and 9d each of which is used for the suppression of the short channel effect, the short channel effect can be suppressed or prevented even if the gate lengths of the pMISQp1 and nMISQn1 are made short. It is thus possible to promote an improvement in the degree of device integration and a scale-down of the chip size.

In the present embodiment, however, the impurity concentration of each semiconductor region 9c for the suppression of the short channel effect, of the pMISQp1 of the input first stage, is lower than that of each of the semiconductor regions 9a for the suppression of the short channel effect, of the pMISQp2 of the next stage. Further, the impurity concentration of each of the semiconductor regions 9d for the suppression of the short channel effect, of the nMISQn1 of the input first stage, is also lower than that of each of the semiconductor regions 9b for the suppression of the short channel effect of the nMISQn2 of the next stage. Thus, an internal field strength of a channel region for the pMISQp1 and nMISQn1 of the input first stage can be relaxed as compared with an internal field strength of a channel region for the pMISQp2 and nMISQn2 of the next stage. Therefore, the problem concerning hot carriers of the pMISQp1 and nMISQn1 of the input first stage, which has been newly discovered by the present inventors, can be avoided, and an improvement in the resistance to the hot carriers can be achieved.

In the present embodiment as well, the impurity concentrations of the extension regions 4a and 7a of the pMISQp1 and nMISQn1 of the input first stage are respectively made identical to those of extension regions 8a and 10a of the pMISQp2 and nMISQn2 of the next stage. Therefore, a current for driving each of the pMISQp1 and nMISQn1 of the input first stage can be improved, and the speed of operating each of the pMISQp1 and nMISQn1 can be enhanced.

In order to form the semiconductor regions 9c for the suppression of the short channel effect, of the pMISQp1 of such an input first stage, they may be formed by ion-implanting, for example, phosphor or arsenic into the substrate 1S using the resist pattern PR3 as the mask during the process shown in FIG. 8. At this time, the dose of an impurity may be adjusted in such a manner that the impurity concentration of each semiconductor region 9c for the suppression of the short channel effect becomes lower than that of each of the semiconductor regions 9a for the suppression of the short channel effect of the pMISQp2 of the next stage.

In order to form the semiconductor regions 9d for the suppression of the short channel effect, of the nMISQn1 of the input first stage, they may be formed by ion-implanting, for example, boron (B) into the substrate 1S using the resist patterns PR5 as masks during the process shown in FIG. 10. At this time, the dose of an impurity may be adjusted in such a manner that the impurity concentration of each semiconductor region 9d for the suppression of the short channel effect becomes lower than that of each of the semiconductor regions 9b for the suppression of the short channel effect of the nMISQn2 of the next stage.

Third Embodiment

Figure 15:
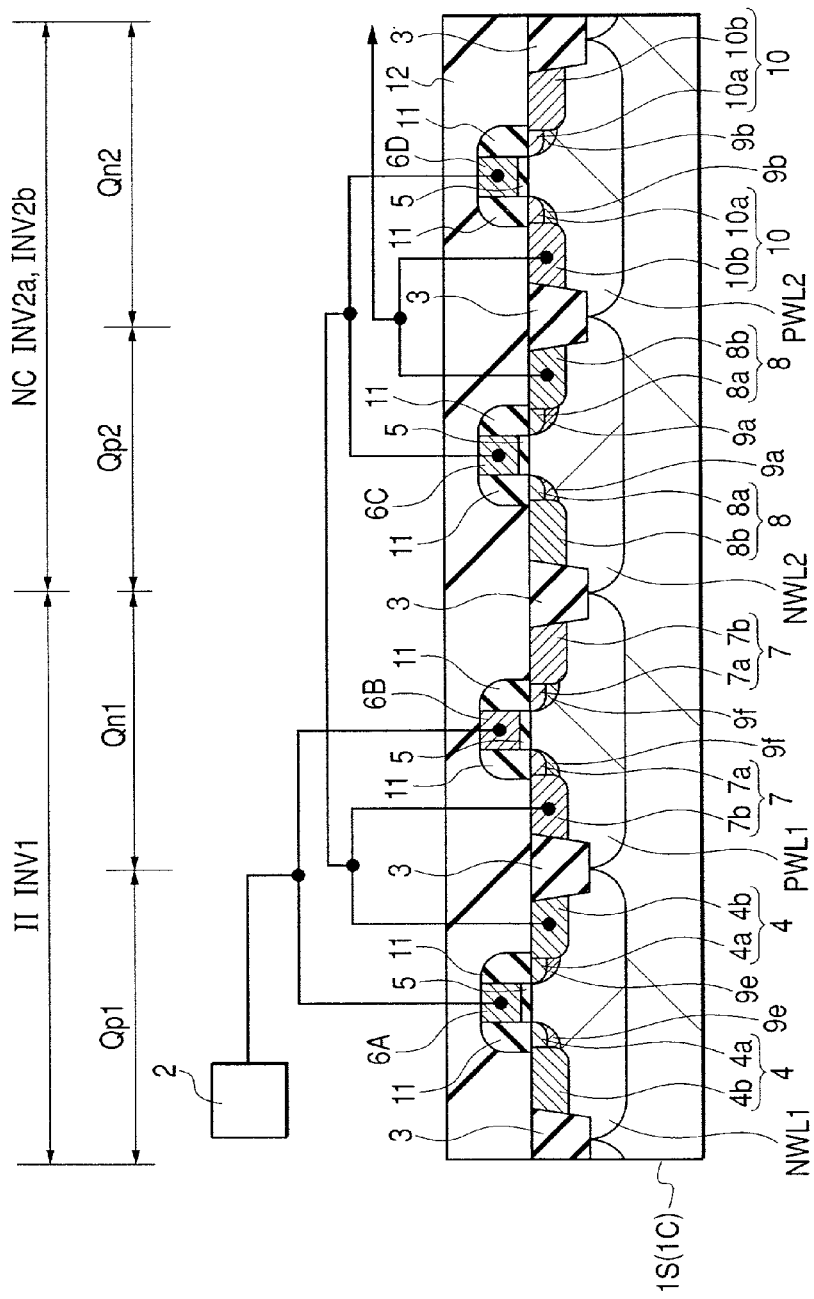
FIG. 15 is a fragmentary cross-sectional view of a semiconductor device according to a further embodiment of the present invention.

FIG. 15 shows as one example a fragmentary cross-sectional view of a semiconductor device which represents a further embodiment of the present invention and is at the same place as FIG. 3.

In the present embodiment, a drain structure of pMISQp1 and nMISQn1 of an input first stage has semiconductor regions 9e and 9f each of which is used for the suppression of a short channel effect. An impurity of the same conduction type is introduced in the same concentration so that the semiconductor regions 9e for the suppression of the short channel effect, of the pMISQp1 of the input first stage, are partly formed at the same position as that described in the semiconductor regions 9a for the suppression of a short channel effect of a pMISQp2 of the next stage. Further, an impurity of the same conduction type is introduced in the same concentration so that the semiconductor regions 9f for the suppression of the short channel effect of the nMISQn1 of the input first stage, are partly formed at the same position as that described for the semiconductor regions 9b for the suppression of the short channel effect of the nMISQn2 of the next stage. Owing to the provision of such semiconductor regions 9e and 9f, each of which is used for the suppression of the short channel effect, the short channel effect can be suppressed or prevented even if the gate lengths of the pMISQp1 and nMISQn1 are made short in a manner similar to the second embodiment. It is also possible to promote an improvement in the degree of device integration and a scale-down of the chip size.

In the present embodiment, however, the impurity concentration of each extension region 4a of the pMISQp1 of the input first stage is lower than that of each of the extension regions 8a of the pMISQp2 of the next stage. Further, the impurity concentration of each of the extension regions 7a of the nMISQn1 of the input first stage is also lower than that of each of extension regions 10a of the nMISQn2 of the next stage. Thus, an internal field strength of a channel region for the pMISQp1 and nMISQn1 of the input first stage can be relaxed as compared with an internal field strength of a channel region for the pMISQp2 and nMISQn2 of the next stage. Therefore, the problem concerning hot carriers of the pMISQp1 and nMISQn1 of the input first stage, which has been newly discovered by the present inventors, can be avoided and an improvement in the resistance to the hot carriers can be achieved.

The semiconductor regions 9e and 9f for the suppression of the short channel effects of the pMISQp1 and nMISQn1 of such an input first stage may be formed in a manner similar to the second embodiment. In the present embodiment, however, the semiconductor regions 9e and 9f are respectively set to be substantially identical to the semiconductor regions 9a and 9b for the suppression of the short channel effects of the pMISQp2 and nMISQn2 of the next stage in their forming positions and impurity concentrations. As to the extension regions 4a and 7a of the pMISQp1 and nMISQn1 of the input first stage, the dose of impurity may be reduced as compared with one described in the first embodiment.

As to a modification of the present embodiment described above, the impurity concentrations of semiconductor regions 9e and 9f for the suppression of short channel effects of pMISQp1 and nMISQn1 of an input first stage may respectively be set lower than those of semiconductor regions 9a and 9b for the suppression of short channel effects of pMISQp2 and nMISQn2 of the next stage in a manner similar to the second embodiment. Since, in this case, the internal field strength of a channel region for the pMISQp1 and nMISQn1 of the input first stage can be further relaxed as compared with an internal field strength of a channel region for the pMISQp2 and nMISQn2 of the next stage, the problem of hot carriers of the pMISQp1 and nMISQn1 of the input first stage, which has been newly discovered by the present inventors, can be avoided and the resistance to the hot carriers can be enhanced as compared with the drain structure employed in the third embodiment.

Fourth Embodiment

In connection with the fourth embodiment, the description will be directed to a case in which the present invention is applied to a semiconductor device wherein a plurality of MISs different in operating voltage from one another are disposed on the same chip (substrate).

Figure 16:
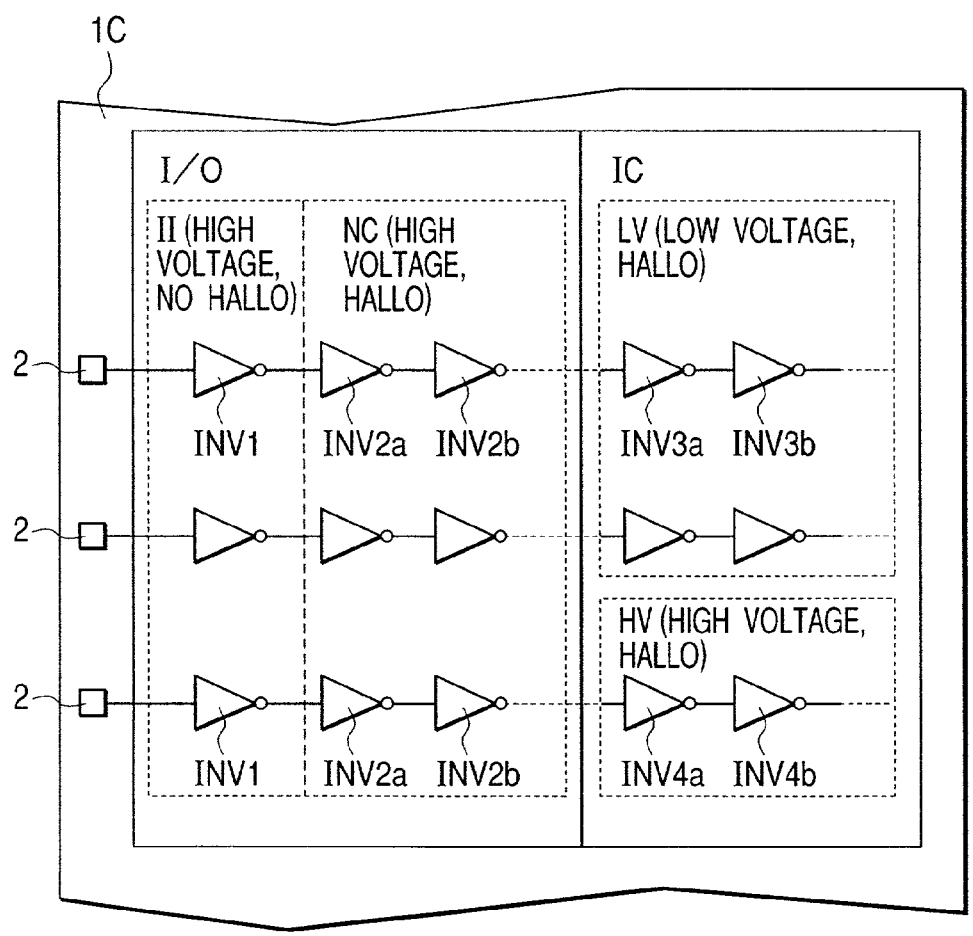
FIG. 16 is a schematic circuit diagram of a semiconductor device according to a still further embodiment of the present invention.
Figure 17:
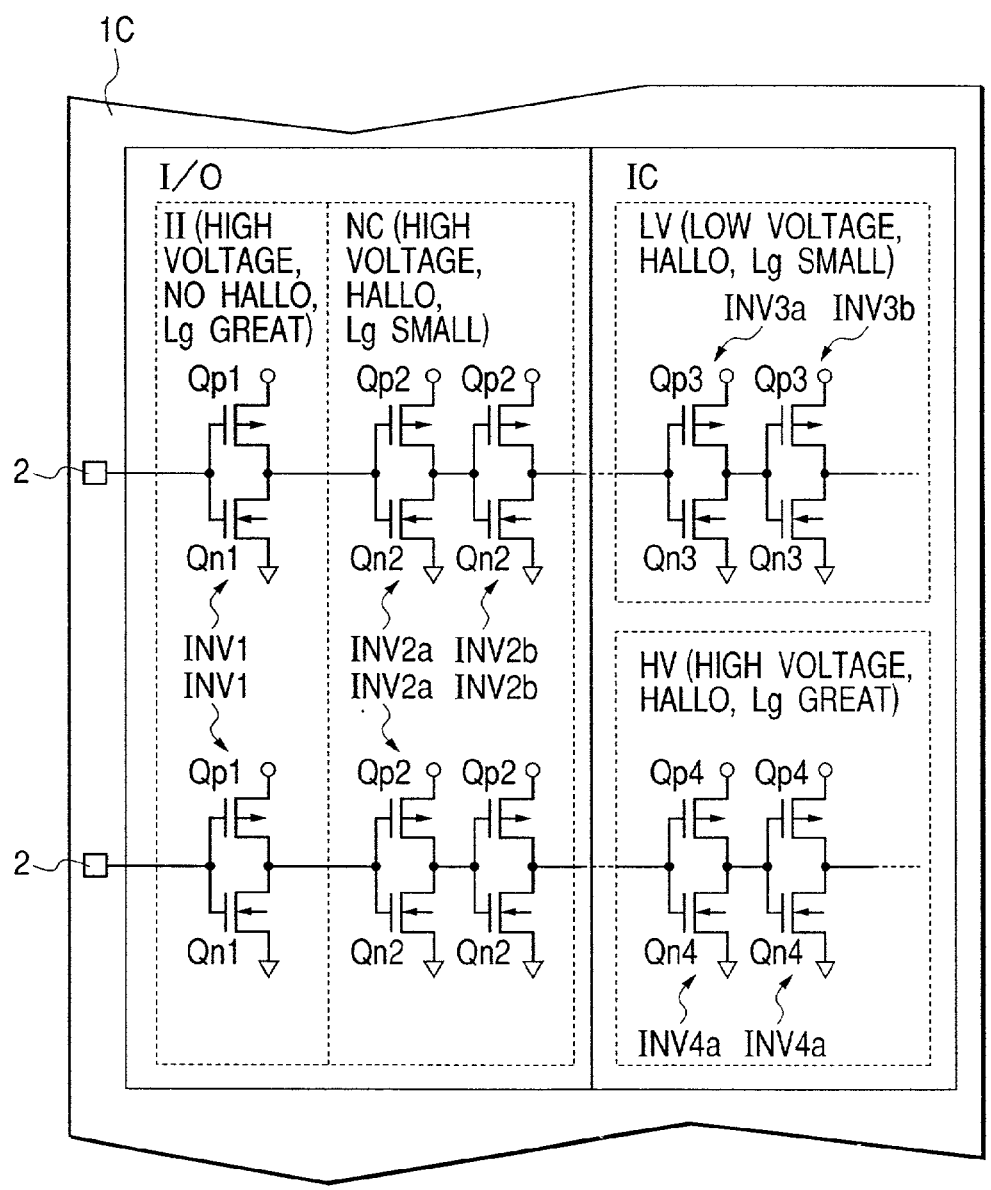
FIG. 17 is a schematic circuit diagram of the semiconductor device at a location similar to FIG. 16.

FIGS. 16 and 17 are respective views of a chip 1C which constitutes the semiconductor device. FIG. 16 shows circuits formed on the chip 1C in the form of logic symbols, and FIG. 17 shows the configurations of the logic symbols in more detail. An input circuit for an input/output circuit region I/O, and low-voltage and high-voltage circuits for an internal circuit are illustrated here. The input circuit for the input/output circuit region I/O is substantially identical to the first through third embodiments. The present embodiment is different from other embodiments in particular in that operating voltages for an inverter circuit INV1 of an input first stage and inverter circuits INV2a and INV2b of the next stage in the input circuit are relatively high. A source voltage (first operating voltage) on the high-potential side of the high-voltage circuit, that is relatively high in operating voltage, is about 3.3V, for example. Further, a source voltage (second operating voltage) on the high-potential side of the low-voltage circuit, that is relatively low in operating voltage, is about 1.5V, for example.

Referring to FIGS. 16 and 17, a low-voltage circuit region LV and a high-voltage circuit region HV are illustrated in the internal circuit IC by way of example. Further, low-voltage inverter circuits INV3a, INV3b, . . . and high-voltage inverter circuits INV4a, INV4b, . . . are illustrated herein by way of example. However, the circuits disposed in the internal circuit are not limited to these inverter circuits and can be changed in various ways. Medium-scale or large-scale cells or the like, which comprise basic logic gates like, for example, a NAND circuit, a NOR circuit, an AND circuit, an OR circuit and an EXOR circuit, etc., or combinations of these, are provided.

The low-voltage inverter circuits INV3a, INV3b, . . . comprise CMIS inverter circuits and have pMISQp3 and nMISQn3 (third field effect transistor), respectively. Further, the high-voltage inverter circuits INV4a, INV4b, . . . also comprise CMIS inverter circuits and have pMISQp4 and nMISQn4 (fourth field effect transistor), respectively. Even in the case of any of the pMISQp3 and pMISQp4, and nMISQn3 and nMISQn4 used for the high-voltage and low-voltage system, the semiconductor regions (hallo regions) for the suppression of the short channel effects are included in their drain structures. In order to achieve improvements in the operating speed and the degree of device integration, the gate lengths of the low-voltage pMISQp3 and nMISQn3 in the internal circuit are respectively set to be smaller than those of the high-voltage pMISQp4 and nMISQn4 in the internal circuit and are of the minimum as a whole. The operating voltages for the low-voltage and high-voltage systems in this case are identical to the first embodiment.

Figure 18:
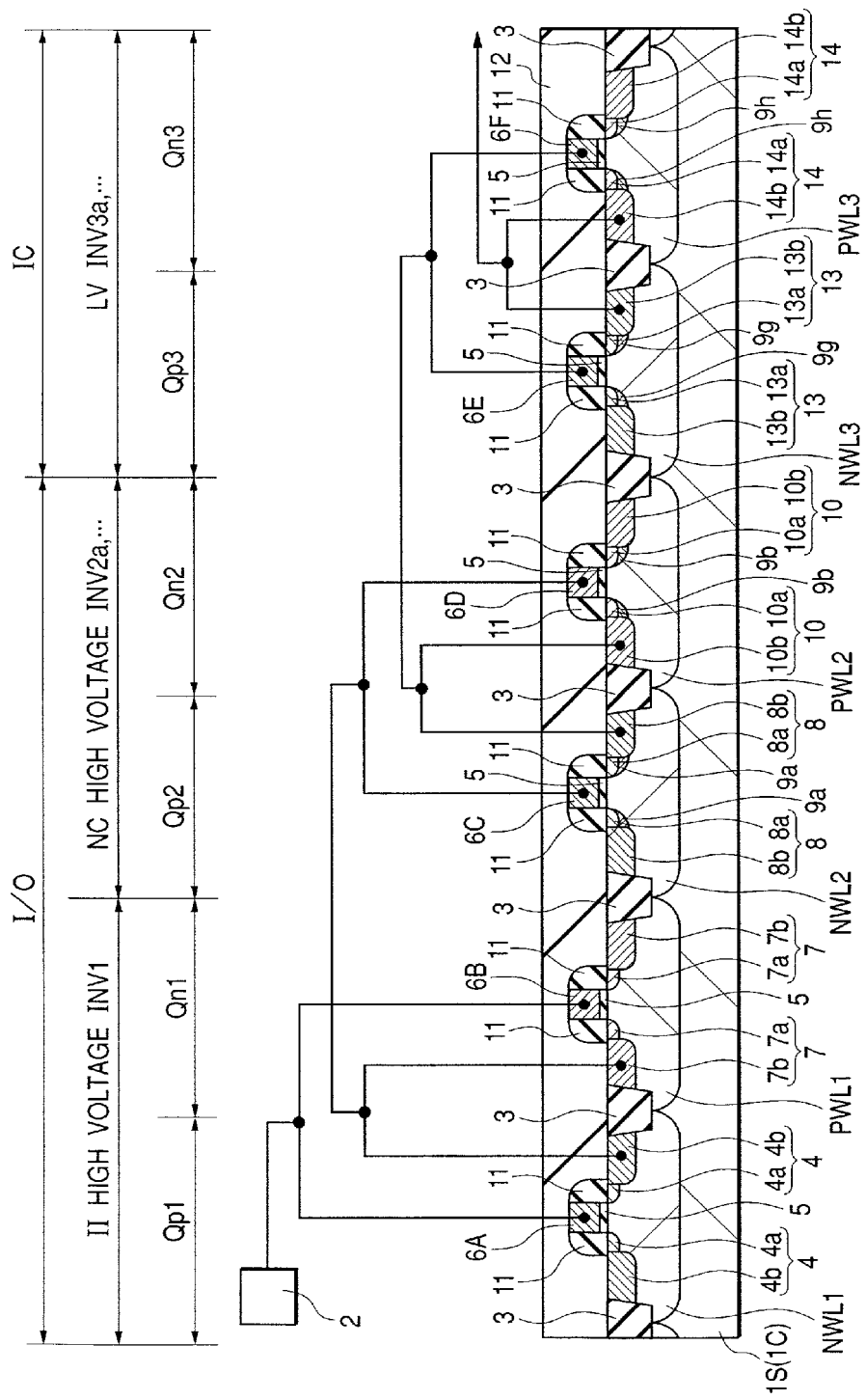
FIG. 18 is a fragmentary cross-sectional view of the semiconductor device shown in FIG. 16.

FIG. 18 is a fragmentary cross-sectional view of the semiconductor device shown in FIG. 16. The structure of the input/output circuit region I/O is substantially identical to the first embodiment. The present structure is different therefrom in particular in that gate insulating films 5 are different in thickness between the high-voltage and low-voltage systems. Namely, the thickness of the gate insulating film 5 for the high-voltage system is thicker than that of the gate insulating film 5 for the low-voltage system. This is because, in the high-voltage system, the thickness of each gate insulating film 5 may preferably be relatively thick from the viewpoint of securing of a withstand voltage for the gate insulating film 5, whereas in the low-voltage system, the thickness of each gate insulating film 5 may preferably be relatively thin from the viewpoint of the achievement of an improvement in characteristics like operating speed, etc. The thickness of each relatively thick gate insulating film 5 is about 8 mm, for example. The thickness of each relatively thin gate insulating film 5 is about 3.5 mm, for example.

On the other hand, since the pMISQp1 and nMISQn1 of the inverter circuit INV1 of the input first stage, the inverter circuits INV2a and INV2b of the next stage, and the inverter circuits INV4a and INV4b included in some of the internal circuit belong to the high-voltage system, the gate insulating films 5 are relatively thick. While this is preferable from the viewpoint of securing the withstand voltage, the problem of hot carriers becomes pronounced as each gate insulating film 5 becomes thick. Since the present embodiment is set to a structure similar to the first embodiment, the problem of the hot carriers can be avoided. It is therefore possible to enhance the reliability and life of the semiconductor device having MISs for the high-voltage system. Except for it, an effect similar to the first embodiment can be obtained.

The low-voltage inverter circuits INV3a, INV3b, . . . in the internal circuit are illustrated in FIG. 18 by way of example in addition to the input/output circuit region I/O.

The pMISQp3, which constitutes each of the low-voltage inverter circuits INV3a and INV3b for the internal circuit, is formed in its corresponding n well NWL3 and includes a pair of semiconductor regions 13 for a source and a drain, a gate insulating film 5 and a gate electrode 6E. A channel for the pMISQp3 also serves as a surface channel. The gate length of the pMISQp3 ranges from about 0.20 μm to about 0.80 μm, for example. Incidentally, the n well NWL3 is identical to an n well NWL1.

Each of the semiconductor regions 13 has an extension region 13a, and a p$^+$-type semiconductor region 13b. The extension region 13a is disposed so as to adjoin the channel for the pMISQp3. The p$^+$-type semiconductor region 13b is placed at a position spaced from the channel by the extension region 13a. For example, boron for forming semiconductor regions of the same conduction type is introduced into the extension regions 13a and the p$^+$-type semiconductor regions 13b. However, the extension region 13a is set so as to become lower than the p$^+$-type semiconductor region 13b in impurity concentration. The function of the extension region 13a is identical to the extension region 8a or the like described above. The extension region 13a and the p$^+$-type semiconductor region 13b are formed in a manner similar to the extension region 4a and the p$^+$-type semiconductor region 4b of the pMISQp1 of the input first stage. Incidentally, the impurity concentration of each extension region 13a in the internal circuit may be set higher than that of each extension region 4a of the input/output circuit region I/O.

However, a drain structure of the pMISQp3 constituting the inverter circuits INV3a and INV3b in the internal circuit has semiconductor regions 9g (hallo regions) each of which is used for the suppression of a short channel effect. The semiconductor regions 9g each used for the suppression of the short channel effect are formed in a manner similar to semiconductor regions 9a each used for the suppression of a short channel effect of the pMISQp2 in the inverter circuits INV2a, INV2b, . . . of the next stage. Providing such semiconductor regions 9g, each used for the suppression of the short channel effect, allows suppression or prevention of the short channel effect of the pMISQp3 of the internal circuit, shortest in gate length. Incidentally, the impurity concentration of each semiconductor region (hallo region) 9g for the suppression of the short channel effect in the internal circuit may be set higher than that of each semiconductor region 9a for the suppression of the short channel effect in the input/output circuit region I/O.

Further, the thickness of the gate insulating film 5 of the pMISQp3 is thinner than that of the gate insulating film 5 of each high-voltage MIS, as described above. Thus, an improvement in operating speed of the pMISQp3 can be promoted. The gate electrode 6E is electrically connected to the output of each of the inverter circuits of the next stage through wirings. The outputs of the inverter circuits INV3a, INV3b, . . . in the internal circuit are further electrically connected to logic gates or the like provided in a subsequent stage. Incidentally, since the gate electrode 6E is identical to a gate electrode 6A of the pMISQp1 of the input first stage in structure and forming method, the description thereof will be omitted.

The nMISQn3, which constitutes each of the inverter circuits INV3a and INV3b for the internal circuit, is formed in its corresponding p well PWL3 and includes a pair of semiconductor regions 14 for a source and a drain, a gate insulating film 5 and a gate electrode 6F. A channel for the nMISQn3 also serves as a surface channel. The gate length of the nMISQn3 ranges from about 0.20 µm to about 0.80 µm, for example. Incidentally, the p well PWL3 is identical to a p well PWL1.

Each of the semiconductor regions 14 has an extension region 14a, and an n$^+$-type semiconductor region 14b. The extension region 14a is disposed so as to adjoin the channel for the nMISQn4. The n$^+$-type semiconductor region 14b is placed at a position spaced from the channel by the extension region 14a. For example, phosphor or arsenic for forming semiconductor regions of the same conduction type is introduced into the extension regions 14a and the n$^+$-type semiconductor regions 14b. However, the extension region 14a is set so as to become lower than the n$^+$-type semiconductor region 14b in impurity concentration. The function of the extension region 14a is identical to the extension region 10a or the like described above. The extension region 14a and the n$^+$-type semiconductor region 14b are formed in a manner similar to an extension region 7a and an n$^+$-type semiconductor region 7b of the nMISQn1 of the input first stage. Incidentally, the impurity concentration of each extension region 14a in the internal circuit may be set to be higher than that of each extension region 7a of the input/output circuit region I/O.

However, a drain structure of the nMISQn3 constituting the inverter circuits INV3a and INV3b in the internal circuit has semiconductor regions 9h (hallo regions) each of which is used for the suppression of a short channel effect. The semiconductor regions 9h each used for the suppression of the short channel effect are formed in a manner similar to semiconductor regions 9b each used for the suppression of a short channel effect, of an nMISQn2 in each of the inverter circuits INV2a, INV2b, . . . subsequent to the next stage. Providing such semiconductor regions 9h, each used for the suppression of the short channel effect, allows suppression or prevention of the short channel effect of the nMISQn3 of the internal circuit, shortest in gate length. Incidentally, the impurity concentration of each semiconductor region (hallo region) 9h for the suppression of the short channel effect in the internal circuit may be set to be higher than that of each semiconductor region 9b for the suppression of the short channel effect in the input/output circuit region I/O.

Further, the thickness of the gate insulating film 5 of the nMISQn3 is thinner than that of the gate insulating film 5 of each high-voltage MIS, as described above. Thus, an improvement in operating speed of the nMISQn3 can be promoted. The gate electrode 6F is electrically connected to the output of each of the inverter circuits subsequent to the next stage through wirings. The outputs of the inverter circuits INV3a, INV3b, . . . in the internal circuit are further electrically connected to logic gates or the like provided in a subsequent stage. Incidentally, since the gate electrode 6F is identical to the gate electrode 6A of the pMISQp1 of the input first stage in structure and forming method, the description thereof will be omitted.

Incidentally, the pMISQp4 and nMISQn4, which constitute the high-voltage inverter circuits INV4a, INV4b, . . . in the internal circuit, are identical to the pMISQp2 and nMISQn2 of the inverter circuits INV2a, INV2b, . . . subsequent to the next stage.

Fifth Embodiment

Figure 19:
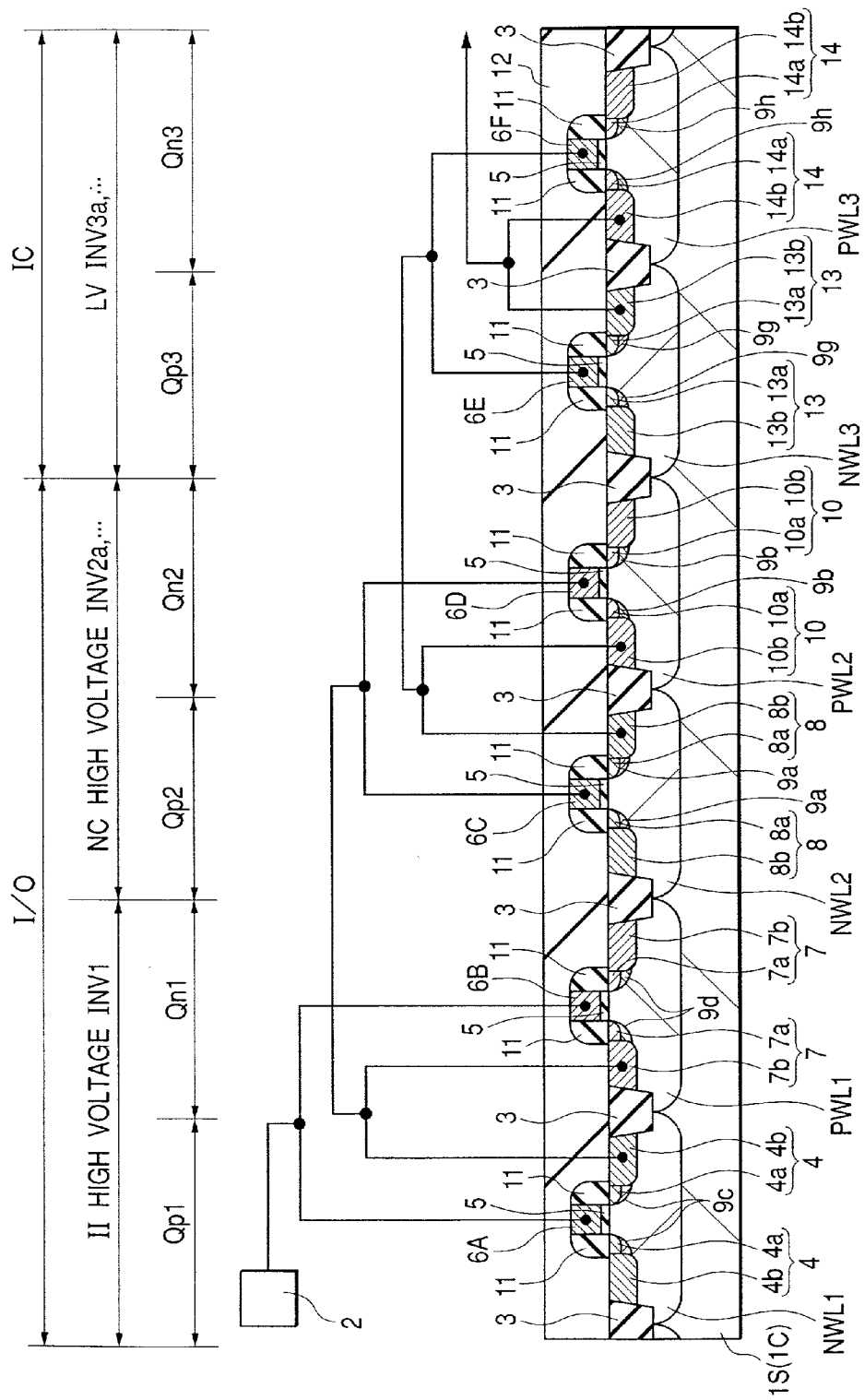
FIG. 19 is a fragmentary cross-sectional view of a semiconductor device according to a still further embodiment of the present invention.

FIG. 19 shows as one example a fragmentary cross-sectional view of a semiconductor device which represents a still further embodiment of the present invention and is at the same place as FIG. 18.

The present embodiment is one wherein the technique described for the second embodiment is applied to a semiconductor device in which a plurality of MISs different in operating voltage are disposed on the same chip (substrate). Namely, in the present embodiment, the impurity concentrations of semiconductor regions 9c and 9d for the suppression of short channel effects, of pMISQp1 and nMISQn1 of an input first stage, are respectively lower than those of semiconductor regions 9a and 9b for the suppression of short channel effects of pMISQp2 and nMISQn2 of the next stage. Thus, according to the present embodiment, effects obtained by the second embodiment and the fourth embodiment can be achieved.

Sixth Embodiment

Figure 20:
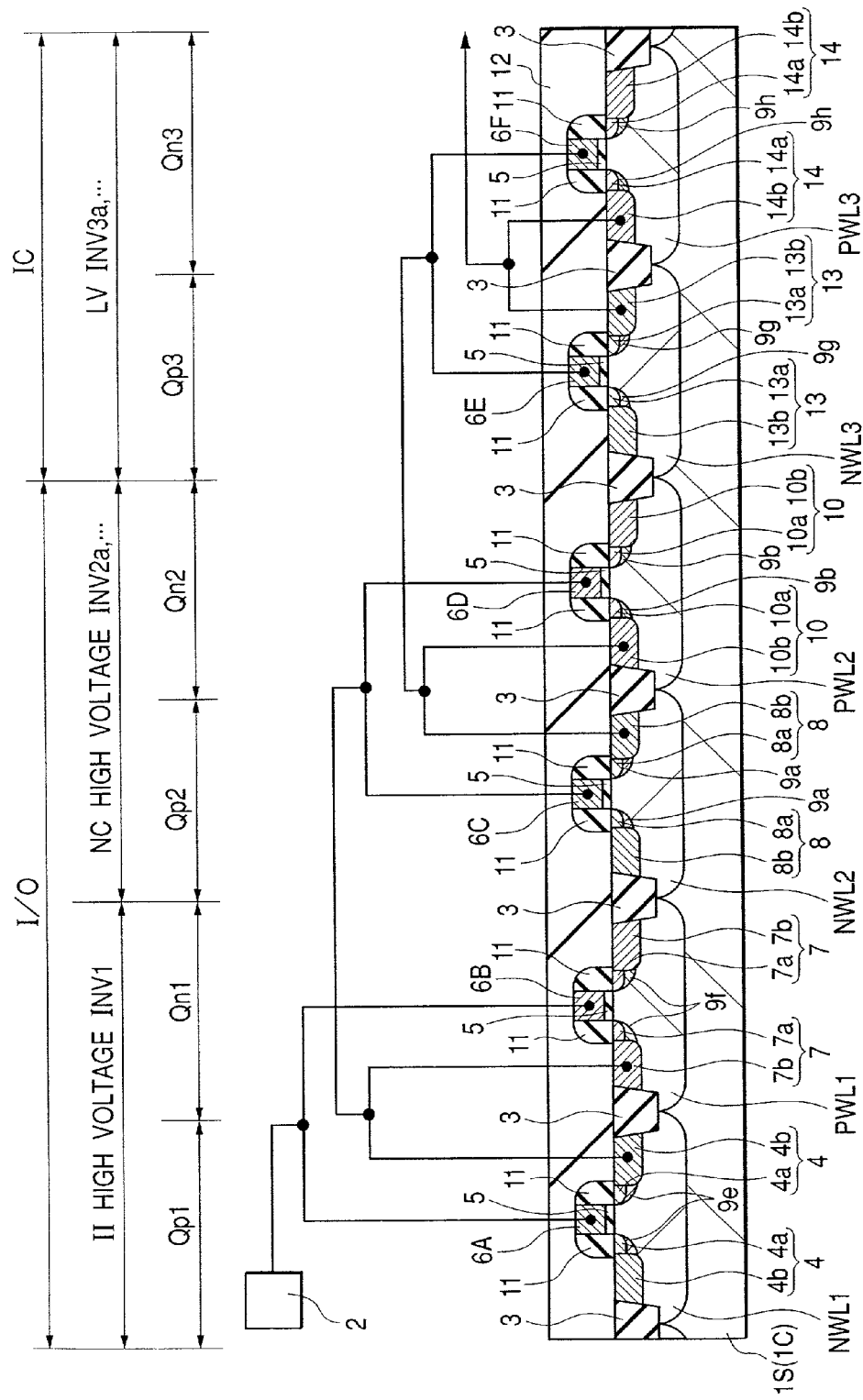
FIG. 20 is a fragmentary cross-sectional view of a still further embodiment of the present invention.

FIG. 20 shows as one example a fragmentary cross-sectional view of a semiconductor device which represents a still further embodiment of the present invention and is at the same place as FIG. 18.

The present embodiment is one wherein the technique described for the third embodiment is applied to a semiconductor device in which a plurality of MISs different in operating voltage are disposed on the same chip (substrate). Namely, in the present embodiment, the impurity concentrations of extension regions 4a and 7a of pMISQp1 and nMISQn1 of an input first stage are respectively lower than those of extension regions 8a and 10a of pMISQp2 and nMISQn2 of the next stage. Thus, according to the present embodiment, effects obtained by the third embodiment and the fourth embodiment can be achieved.

As to a modification of the present embodiment described above, the impurity concentrations of semiconductor regions 9e and 9f for the suppression of short channel effects, of pMISQp1 and nMISQn1 of an input first stage, may respectively be set to be lower than those of semiconductor regions 9a and 9b for the suppression of short channel effects of pMISQp2 and nMISQn2 of the next stage in a manner similar to the fifth embodiment. Thus, effects obtained by the modification of the third embodiment and the fourth embodiment can be achieved.

Seventh Embodiment

Figure 21:
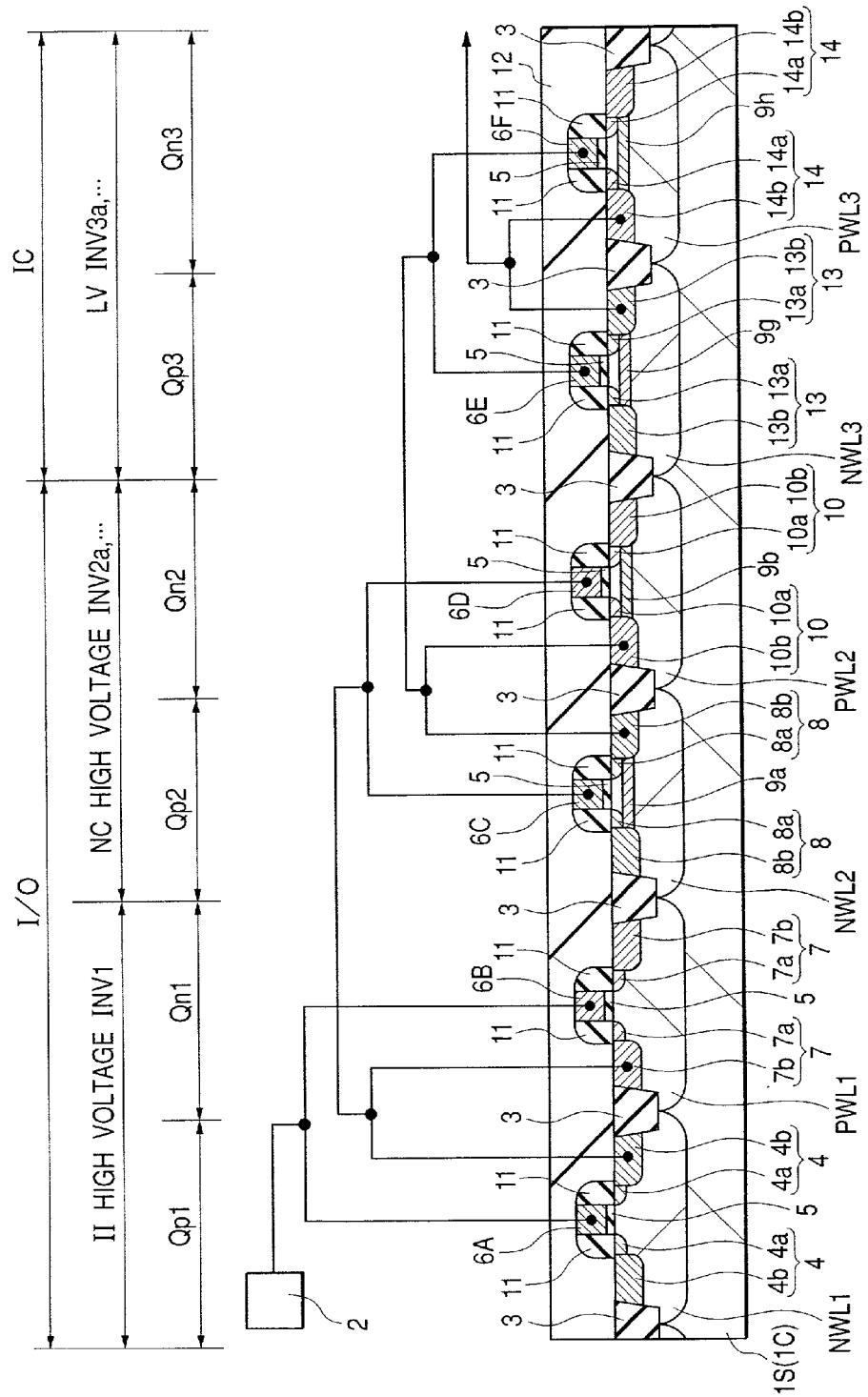
FIG. 21 is a fragmentary cross-sectional view of a semiconductor device according to a still further embodiment of the present invention.

FIG. 21 shows as one example a fragmentary cross-sectional view of a semiconductor device which represents a still further embodiment of the present invention and is at the same place as FIG. 18.

In the present embodiment, semiconductor regions 9a, 9b, 9g and 9h for the suppression of short channel effects are formed in an extended state so as to be placed even below channels without being partly placed and so as to act as bridges between semiconductor regions for sources and drains, as shown in FIG. 21, in the techniques of the first and second embodiments. Depth or vertical positions to be formed, of the semiconductor regions 9a, 9b, 9g and 9h for the suppression of the short channel effects, are identical to those described for the first and fourth embodiments or the like.

Even in the case of the present embodiment, effects similar to the first and fourth embodiments can be obtained.

Eighth Embodiment

Figure 22:
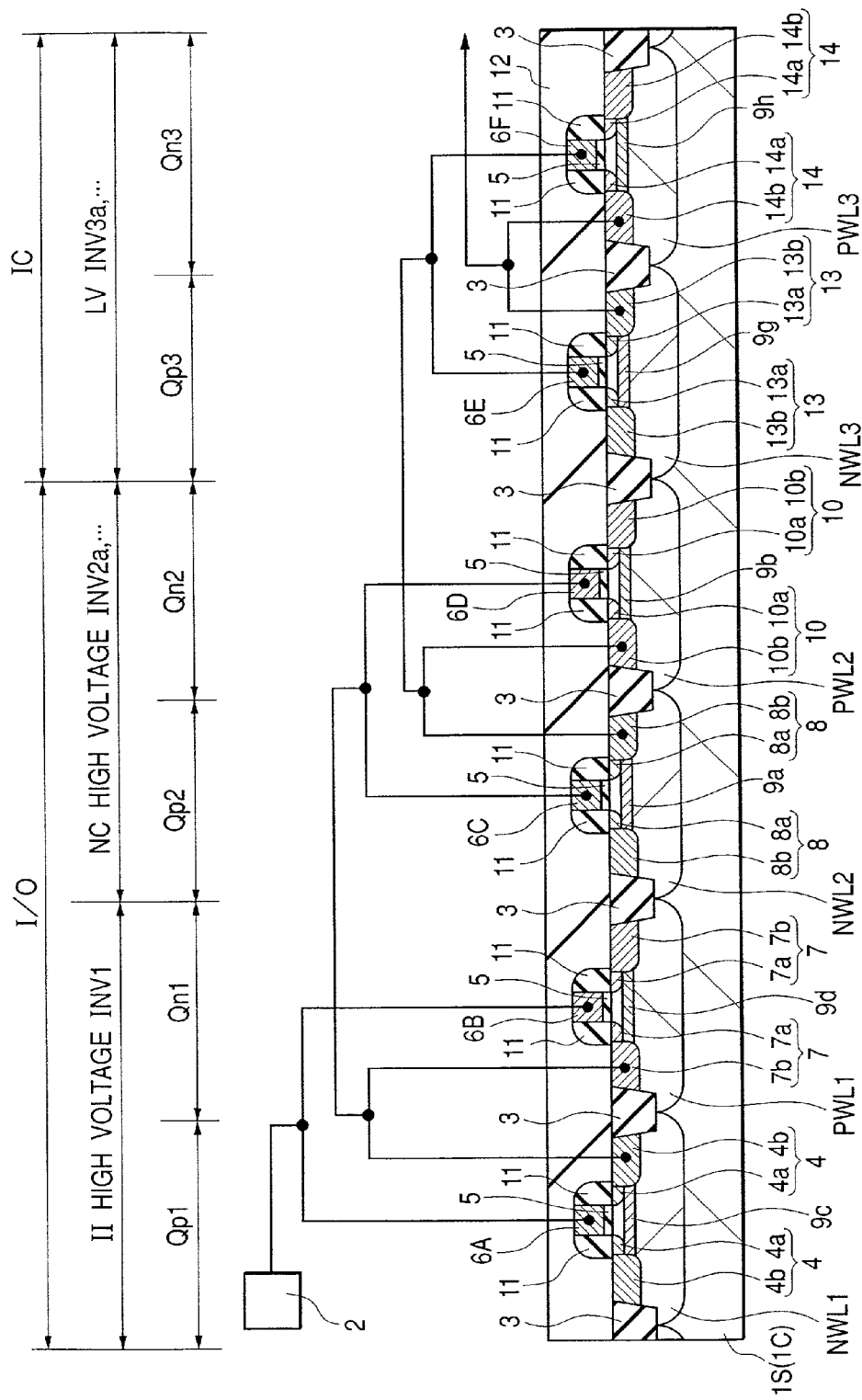
FIG. 22 is a fragmentary cross-sectional view of a semiconductor embodiment according to a still further embodiment of the present invention.

FIG. 22 shows as one example a fragmentary cross-sectional view of a semiconductor device which represents a still further embodiment of the present invention and is at the same place as FIG. 18.

The present embodiment is one wherein the technique described for the seventh embodiment is applied to the techniques of the second and fifth embodiments, as shown in FIG. 22. Namely, semiconductor regions 9a, 9b, 9g, 9h, 9c and 9d for the suppression of short channel effects are formed in an extended fashion so as to be placed even below channels without being partly placed and so as to act as bridges between semiconductor regions for sources and drains in a manner similar to the seventh embodiment. Depth or vertical positions to be formed, of the semiconductor regions 9a, 9b, 9g, 9h, 9c and 9d for the suppression of the short channel effects, are identical to those described for the second and fifth embodiments or the like. As described in the second and fifth embodiments, the impurity concentrations of the semiconductor regions 9c and 9d for the suppression of the short channel effects are respectively lower than those of the semiconductor regions 9a and 9b for the suppression of the short channel effects.

Accordingly, effects similar to the second, fifth and seventh embodiments can be obtained even in the case of the present embodiment.

Structures of such semiconductor regions 9a, 9b, 9g, 9h, 9c and 9d for the suppression of the short channel effects can also be applied to the third and sixth embodiments and their modifications. Even in that case, effects obtained by the third and sixth embodiments and their modifications can be achieved.

While the invention made by the present inventors has been described specifically based on various illustrated embodiments, the present invention is not limited to the described embodiments. It is needless to say that various changes can be made thereto within a scope not departing from the substance thereof.

While, for example, the first through eighth embodiments respectively have been directed to the case where the gate insulating film is formed as a silicon oxide film or an oxynitride film, no such limitation is imposed on the invention. For example, a single-part film made up of a silicon nitride film, a laminated film obtained by laminating a silicon nitride film on a thin silicon nitride film, or a ferroelectric film or a high-dielectric-constant film may be used.

While the first through eighth embodiments respectively have been directed to the case in which each gate electrode is formed by patterning a polysilicon film or another conductor or conductive film, the present invention is not limited to it. A so-called damascene electrode may be adopted which is formed by digging a gate electrode forming trench in an interlayer insulator or dielectric and embedding a conductive film into the trench, for example.

The technique of the third embodiment may be applied to the first embodiment. Namely, the impurity concentrations of the semiconductor regions (extension regions in particular) for the source and drain of the MISs of the inverter circuit in the input first stage may be set to be lower than those of the semiconductor regions (extension regions in particular) for the source and drain of the MISs of the inverter circuits of the next stage. Since the internal field strength in the channel for the MISs of the input first stage can be relaxed, the problem of hot carriers, which has been newly discovered by the present inventors, can be avoided, and hence an improvement in the resistance to hot carriers can be achieved.

While the first through eighth embodiments respectively have been directed to the case in which both the pMIS and nMIS of the inverter circuit of the input first stage are configured as structures having no semiconductor regions for the suppression of short channel effects, the present invention is not limited to such arrangements. For example, the pMIS alone of the inverter circuit of the input first stage may be configured as a structure having no semiconductor region for the suppression of the short channel effect.

While the first through eighth embodiments respectively have been directed to the case wherein the gate electrode of a pMIS is configured as the p type and the gate electrode of nMIS is configured as the p type, the present invention is not limited to this. The present invention can be applied even to a case in which the gate electrode of a pMIS is set as the n type and the gate electrode of nMIS is set as the p type, for example.

While the above description has principally been directed to the case in which the invention made by the present inventors is applied to a semiconductor device having logic circuits, which belongs to the field of application corresponding to the background of the invention, the present invention is not limited to this. The present invention can be applied even to, for example, a semiconductor device having a memory circuit like a DRAM (Dynamic Random Access Memory), a SRAM (Static Random Access Memory) or a flash memory (EEPROM: Electric Erasable Programmable Read Only Memory) or the like, or a mixed-type semiconductor device, wherein the memory circuit and a logic circuit like a CPU (Central Processing Unit) or a processor or the like are provided on the same semiconductor substrate.

Advantageous effects obtained by a typical aspects of the invention disclosed in the present application will be described in brief as follows.

According to the present invention, a drain structure of a first field effect transistor, which directly receives a signal inputted from the outside, is formed as a structure having satisfactory hot-carrier resistance and is configured so as to differ from drain structures of field effect transistors other than it. It is thus possible to enhance the hot-carrier resistance of a semiconductor device provided with a plurality of field effect transistors.

What is claimed is:

1. A semiconductor device comprising , a plurality of field effect transistors provided on a common semiconductor substrate and operated at different voltages, which plurality of field effect transistors includes field effect transistors which are higher in operating voltage than others of said plurality of field effect transistors;
    wherein in the field effect transistors which are higher in operating voltage, of the plurality of field effect transistors, a first field effect transistor, which directly receives a signal inputted from outside, is configured so as to differ in drain structure from a second field effect transistor thereof which indirectly receives the signal inputted from outside, and
    wherein the drain structure of the first field effect transistor differs from the drain structure of the second field effect transistor in that the drain structure of second field effect transistor includes regions of opposite conductivity to one another while the drain structure of the first field effect transistor does not include regions of opposite conductivity from one another.

2. The semiconductor device according to claim 1, wherein the drain structure of the first field effect transistor is provided with semiconductor regions for the suppression of a first short channel effect, the drain structure of the second field effect transistor is provided with semiconductor regions for the suppression of a second short channel effect, and the impurity concentrations of the semiconductor regions for the suppression of the first short channel effect are set lower than those of the semiconductor regions for the suppression of the second short channel effect.

3. The semiconductor device according to claim 1, wherein the impurity concentration of a semiconductor region for a drain of the first field effect transistor is set lower than that of a semiconductor region for a drain of the second field effect transistor.

4. The semiconductor device according to claim 1, wherein the first and second field effect transistors are field effect transistors which constitute an input circuit.

5. The semiconductor device according to claim 1, wherein a gate length of a gate electrode of the first field effect transistor is longer than a gate length of a gate electrode of the second field effect transistor.

6. The semiconductor device according to claim 1, wherein a drain structure of a third field effect transistor of the plurality of field effect transistors, which is lower in operating voltage than others of said plurality of field effect transistors, is provided with semiconductor regions for suppression of a short channel effect.

7. The semiconductor device according to claim 6, wherein the third field effect transistor is a field effect transistor which constitutes an internal circuit.

8. The semiconductor device according to claim 7, wherein the internal circuit is provided with a fourth field effect transistor which is one of the plurality of field effect transistors and is relatively higher than the third field effect transistor in operating voltage, and a drain structure of the fourth field effect transistor is provided with semiconductor regions for the suppression of a short channel effect.

9. The semiconductor device according to claim 1, wherein a conduction type of a gate electrode of a p channel type field effect transistor of the plurality of field effect transistors is set as a p type.

10. The semiconductor device according to claim 1, wherein the first field effect transistor is a p channel type field effect transistor.

11. The semiconductor device according to claim 1, wherein the first field effect transistor includes a p channel type field effect transistor and an n channel type field effect transistor.

12. The semiconductor device according to claim 10, wherein the conduction type of the gate electrode of the p channel type field effect transistor is set as a p type.

13. The semiconductor device according to claim 1, wherein a length of a gate electrode of the first field effect transistor is longer than that of a second field effect transistor.

14. A semiconductor device comprising a plurality of field effect transistors provided on a common semiconductor substrate and operated at different voltages, which plurality of field effect transistors includes field effect transistors which are higher in operating voltage than others of said plurality of field effect transistors;
    wherein in the field effect transistors which are higher in operating voltage, of the plurality of field effect transistors, a first field effect transistor, which directly receives a signal inputted from outside, is configured so as to differ in drain structure from a second field effect transistor thereof which indirectly receives the signal inputted from outside, and
    wherein the second field effect transistor indirectly receives the signal inputted from outside through the first field effect transistor.

* * * * *